United States Patent
Khursheed

(10) Patent No.: US 9,601,304 B2
(45) Date of Patent: Mar. 21, 2017

(54) ABERRATION CORRECTION APPARATUS, DEVICE HAVING THE SAME, AND METHOD FOR CORRECTING ABERRATION OF CHARGED PARTICLES

(71) Applicant: National University of Singapore, Singapore (SG)

(72) Inventor: Anjam Khursheed, Singapore (SG)

(73) Assignee: NATIONAL UNIVERSITY OF SINGAPORE, Singapore (SG)

( * ) Notice: Subject to any disclaimer, the term of this patent is extended or adjusted under 35 U.S.C. 154(b) by 0 days.

(21) Appl. No.: 14/834,821

(22) Filed: Aug. 25, 2015

(65) Prior Publication Data

US 2016/0056011 A1     Feb. 25, 2016

Related U.S. Application Data

(60) Provisional application No. 62/041,208, filed on Aug. 25, 2014.

(51) Int. Cl.
H01J 37/145     (2006.01)
H01J 37/153     (2006.01)
(Continued)

(52) U.S. Cl.
CPC ............ *H01J 37/153* (2013.01); *H01J 37/12* (2013.01); *H01J 37/28* (2013.01); *H01J 2237/1516* (2013.01); *H01J 2237/1534* (2013.01)

(58) Field of Classification Search
USPC ...................... 250/396 R, 397, 398, 396 ML
See application file for complete search history.

(56) References Cited

U.S. PATENT DOCUMENTS 7,875,858 B2     1/2011 Ito
7,947,964 B2     5/2011 Ito
(Continued)

OTHER PUBLICATIONS

A. Khursheed, Design of a focused electron beam column for ring—cathode sources, Ultramicroscopy, vol. 128, May 2013, pp. 10-23.

(Continued)

*Primary Examiner* — Nicole Ippolito
(74) *Attorney, Agent, or Firm* — Volpe and Koenig, P.C.

(57) ABSTRACT

According to embodiments of the present invention, an aberration correction apparatus is provided. The aberration correction apparatus includes an aberration correction unit including a first conductive element, and a second conductive element arranged rotationally symmetrical about the first conductive element, wherein the aberration correction unit is arranged to propagate an annular beam having charged particles in between the first conductive element and the second conductive element such that propagation of the annular beam through the aberration correction unit is rotationally symmetrical about the first conductive element, and wherein the aberration correction unit is configured to generate, between the first conductive element and the second conductive element, a magnetic field force and an electric field force directed in opposite directions and superimposed on each other to act on the charged particles to change a trajectory of the charged particles, and an annular aperture optically coupled to the aberration correction unit.

24 Claims, 11 Drawing Sheets

(51) Int. Cl.
*H01J 37/12* (2006.01)
*H01J 37/28* (2006.01)

(56) References Cited

U.S. PATENT DOCUMENTS

| | | | |
|---|---|---|---|
| 9,093,243 B2 | 7/2015 | Khursheed | |
| 2014/0021366 A1* | 1/2014 | Dohi | H01J 3/26 |
| | | | 250/396 R |
| 2014/0158901 A1* | 6/2014 | Sawada | H01J 37/153 |
| | | | 250/396 R |

OTHER PUBLICATIONS

Ray F. Egerton, Physical Principles of Electron Microscopy, An Introduction to TEM, SEM, and AEM, Springer, ISBN: 978-0-387-25800-3 (Print) 978-0-387-26016-7 (Online).
Lorentz 2EM, Integrated Engineering Software Inc., Canada, www.integratedsoft.com.
T. R. Gerholm, S. Flügge (ed.), Optics of Corpuscles/Korpuskularoptik (1956) pp. 609-684.
F. Lenz and AP Wilska, Optik 24 (1966/67) pp. 383-396.
BW Ward, JA Notte and NP Economou, J. Vac. Sci. Technol. B 24 (6) (2006) pp. 2871-2874.
JCH Spence, High-Resolution Electron Microscopy, Oxford University Press, 4th ed (2013).

\* cited by examiner

ABERRATION CORRECTION APPARATUS, DEVICE HAVING THE SAME, AND METHOD FOR CORRECTING ABERRATION OF CHARGED PARTICLES

CROSS-REFERENCE TO RELATED APPLICATION

This application claims the benefit of priority of U.S. provisional application No. 62/041,208, filed 25 Aug. 2014, the content of it being hereby incorporated by reference in its entirety for all purposes.

TECHNICAL FIELD

Various embodiments relate to an aberration correction apparatus, a method for correcting aberration of charged particles and a device employing charged particles.

BACKGROUND

Recently, on-axis electrode geometrical aberration corrector units were reported in the context of ring-cathode electron/ion microscope columns. These on-axis electrode geometrical aberration corrector units were designed for the purpose of cancelling second-order off-axis geometric aberrations in the column, helping to match both off-axis aberrations from the ring-cathode gun lens as well as those from the objective lens.

In a conventional scanning electron/ion microscope, the electric or magnetic lenses that demagnify the primary beam are rotationally symmetric. FIG. 1 shows a schematic side view of a final stage 100 of a conventional electron microscope (e.g., the final stage of a conventional probe forming in an electron/ion microscope). After the primary electron beam 110 emerges from a crossover point 102, typically located mid-way down the column 112, the electron beam 110 travels through a hole aperture 104, and is then focused by an objective lens 106 to a (focal) point 108 (e.g., on a specimen), usually referred to as the beam probe 108 or the electron beam probe 108.

The spatial resolution of scanning electron/ion microscopes may be limited by several objective lens aberrations which determine the smallest possible probe size that can be formed. Typically, there are three main types of aberrations: spherical (S) aberration which is created by variations in angle within the electron beam when traveling through the lens (which, for example, may often dominate in large aperture or long working distance), chromatic (C) aberration which is the beam's inherent energy spread (which, for example, may often dominate at low beam voltage), and diffraction (D) aberration which is generated by the intrinsic wave nature.

The angles at the probe 108 may range from zero to a maximum semi-angle, θ, as shown in FIG. 1, which may scale directly with the aperture radius of the hole aperture 104. All objective lens aberrations (e.g., on-axis aberrations) are functions of the maximum semi-angle θ. Of all three objective lens on-axis aberrations, it is spherical aberration that grows most rapidly with the semi-angle, e.g., the radius of the spherical aberration is proportional to $\theta^3$, while chromatic aberration increases linearly with θ, and diffraction aberration varies inversely proportional with θ.

The probe current, another fundamental parameter of the scanning electron/ion microscopes, may be determined by the transmission area (TM) of the aperture. For example, the probe current is directly proportional to the transmission area of the aperture 104 (e.g., proportional to the square of the aperture radius) and is important for good signal-to-noise ratio (SNR) performance. A higher probe current may be obtained by enlarging the aperture radius. However, this comes at the expense of increasing the radius of the spherical aberration. In practice, in order to minimize the final probe diameter, an optimum semi-angle θ (aperture radius) may be used. The conventional scanning electron microscope is therefore not able to combine high probe current with high spatial resolution, as one must be sacrificed at the expense of the other.

In one example, a charged particle beam corrector and charged particle beam apparatus have been found to have an ability to correct spherical aberration by creating magnetic field by current carrying wires. However, such apparatus increases the chromatic aberration and is not rotationally symmetric, resulting in the impracticality of the apparatus.

In another example, a charged particle beam trajectory corrector and charged particle beam apparatus have been found to have an ability to correct spherical aberration by electric fields. However, this apparatus increases the chromatic aberration.

Thus, there is a need for a mechanism to address at least the above-mentioned problems that uses both magnetic and electric field corrector units to compensate for spherical aberration and/or chromatic aberration, while obtaining high probe current and high spatial resolution at the same time.

SUMMARY

According to an embodiment, an aberration correction apparatus is provided. The aberration correction apparatus may include an aberration correction unit including a first conductive element, and a second conductive element arranged rotationally symmetrical about the first conductive element, wherein the aberration correction unit is arranged to propagate an annular beam comprising charged particles in between the first conductive element and the second conductive element such that propagation of the annular beam through the aberration correction unit is rotationally symmetrical about the first conductive element, and wherein the aberration correction unit is configured to generate, between the first conductive element and the second conductive element, a magnetic field force and an electric field force directed in opposite directions and superimposed on each other to act on the charged particles to change a trajectory of the charged particles, and an annular aperture optically coupled to the aberration correction unit.

According to an embodiment, a method for correcting aberration of charged particles is provided. The method may include providing an annular beam including charged particles, and generating a magnetic field force and an electric field force directed in opposite directions and superimposed on each other to act on the charged particles to change a trajectory of the charged particles.

According to an embodiment, a device employing charged particles is provided. The device may include an aberration correction unit including a first conductive element, and a second conductive element arranged rotationally symmetrical about the first conductive element, wherein the aberration correction unit is arranged to propagate an annular beam comprising charged particles in between the first conductive element and the second conductive element such that propagation of the annular beam through the aberration correction unit is rotationally symmetrical about the first conductive element, and wherein the aberration correction unit is configured to generate, between the first conductive element and the second conductive element, a magnetic field force and an electric field force directed in opposite directions and superimposed on each other to act on the charged particles to change a trajectory of the charged particles; an annular aperture optically coupled to the aberration correction unit, and a lens arrangement optically coupled to the aberration correction unit.

BRIEF DESCRIPTION OF THE DRAWINGS

In the drawings, like reference characters generally refer to like parts throughout the different views. The drawings are not necessarily to scale, emphasis instead generally being placed upon illustrating the principles of the invention. In the following description, various embodiments of the invention are described with reference to the following drawings, in which:

FIGS. 11A and 11B show schematic cross-sectional views of a chromatic aberration unit, according to various embodiments, while

DETAILED DESCRIPTION

Figure 1:
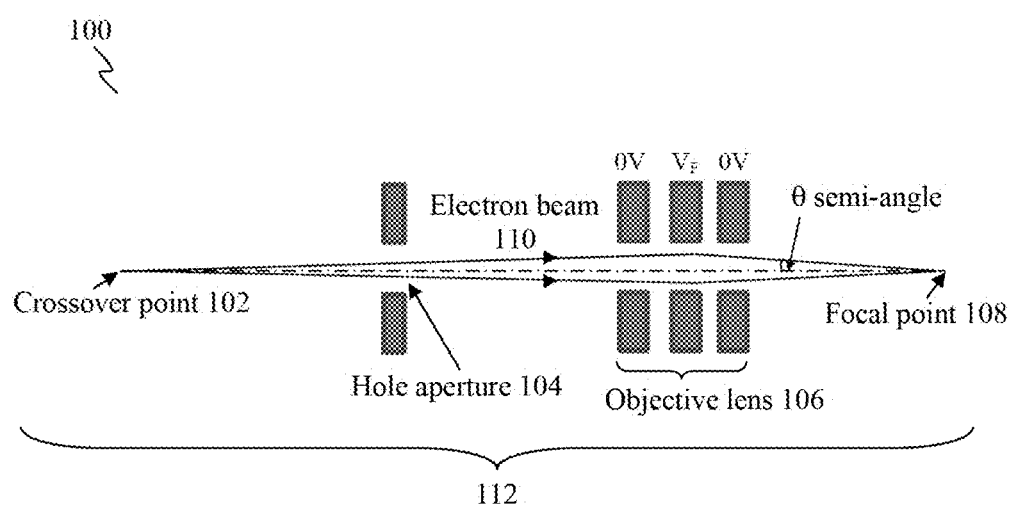
FIG. 1 shows a schematic side view of a final stage of a conventional electron microscope.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Embodiments described in the context of one of the methods or devices are analogously valid for the other methods or devices. Similarly, embodiments described in the context of a method are analogously valid for a device, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

In the context of various embodiments, the articles "a", "an" and "the" as used with regard to a feature or element include a reference to one or more of the features or elements.

In the context of various embodiments, the phrase "at least substantially" may include "exactly" and a reasonable variance.

In the context of various embodiments, the term "about" as applied to a numeric value encompasses the exact value and a reasonable variance.

As used herein, the term "and/or" includes any and all combinations of one or more of the associated listed items.

Various embodiments provide on-axis electrode aberration correctors (or correction units) for scanning electron/ion microscopes.

Various embodiments may provide on-axis electrode spherical aberration correctors (or correction units) and/or on-axis electrode chromatic aberration correctors (or correction units) for scanning electron/ion microscopes.

Various embodiments may provide a design for on-axis electrode correctors for the purpose of correcting spherical aberration and/or chromatic aberration, which may results from an on-axis geometrical aberration of objective lenses, in scanning electron/ion microscopes that use point sources, such as field emission guns. For example, an annular aperture-corrector unit may replace a conventional hole aperture of a scanning electron/ion microscope.

The ultimate spatial resolution of the scanning electron/ion microscopes may be limited by several on-axis objective lens aberrations which may determine the smallest possible probe size that may be formed. Spherical aberration may come from dispersion created by variations in angle within the electron beam as the electron beam travels through the objective lens, chromatic aberration may come from the beam's inherent energy spread, and diffraction aberration may be generated by the intrinsic wave nature of the electron beam. There may be certain situations where the spherical aberration dominates, such as in the case of large apertures or long working distances. In other situations like low beam voltages, the chromatic aberration may mainly determine the final probe size.

Various embodiments may provide a method for reducing the effects of spherical aberration by more than an order of magnitude.

Various embodiments may provide a method for correcting spherical and/or chromatic aberrations of scanning electron/ion microscopes through the use of on-axis electrode corrector units. Unlike conventional annular systems, which either require insertion of a corrector unit into the objective lens gap, or involve the use of special off-axis lenses, the on-axis electrode corrector units in accordance with various embodiments do not require any change to a microscope column design. On-axis electrode corrector units (e.g., see FIGS. 3, 4A, 4B, 11A, 11B), together with an annular aperture, may be employed in various embodiments, to replace a conventional scanning electron/ion microscope's final hole-aperture unit (e.g., 104, FIG. 1). Apart from this, no other modification to the microscope design may be required.

Various embodiments may provide an on-axis electrode aberration correction method for a scanning electron/ion microscope, which may include an annular aperture and a corrector unit (that may be interchangeably referred to as a corrector, a correction unit or a corrector lens unit). Use of high probe current may be combined with high spatial resolution without sacrificing one at the expense of the other. Spherical and/or chromatic aberration may be reduced in the scanning electron/ion microscope. By correcting for these aberrations, the microscope may be operated at high beam currents, long working distances and low beam voltages.

Various embodiments may provide making of correctors connected such that the energy of electrons via electrical and magnetic fields may be manipulated within the corrector (or correctors) so that the chromatic aberration of objective lens may be compensated simultaneously.

Figure 2A:
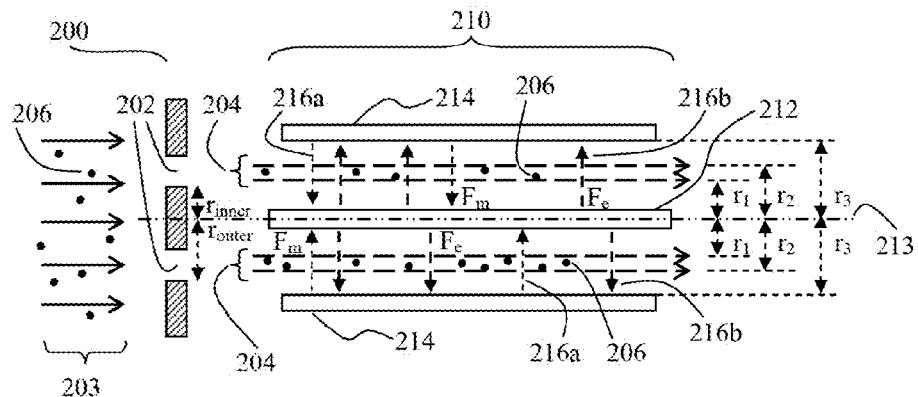
FIG. 2A shows a schematic cross-sectional view of an aberration correction apparatus, according to various embodiments.

It should be appreciated that for simplicity and greater clarity, the descriptions herein refer to only electrons and electron beams, with the understanding that the concept equally applies to other ions and ion beam microscopes FIG. 2A shows a schematic cross-sectional view of an aberration correction apparatus 200, according to various embodiments. The aberration correction apparatus 200 includes an aberration correction unit 210 including a first conductive element 212, and a second conductive element 214 arranged rotationally symmetrical about the first conductive element 212, wherein the aberration correction unit 210 is arranged to propagate an annular beam 204 having charged particles (represented as solid circles 206) in between the first conductive element 212 and the second conductive element 214 such that propagation of the annular beam 204 through the aberration correction unit 210 is rotationally symmetrical about the first conductive element 212, and wherein the aberration correction unit 210 is configured to generate, between the first conductive element 212 and the second conductive element 214, a magnetic field force, $F_m$, (for example, represented by arrows 216a pointing towards the first conductive element 212) and an electric field force, $F_e$, (for example, represented by arrows 216b pointing towards the second conductive element 214) directed in opposite directions and superimposed on each other to act on the charged particles 206 to change a trajectory of the charged particles 206, and an annular aperture 202 optically coupled to the aberration correction unit 210.

In other words, an aberration correction apparatus 200 may be provided. The aberration correction apparatus 200 may include an aberration correction unit 210. The aberration correction unit 210 may include a first conductive element (e.g., central conductive wire or central wire conductor) 212 which may extend along an axis 213 (e.g., corresponding to or coaxial with a central longitudinal axis of the first conductive element 212), and a second conductive element (e.g., (outer) tube conductor) 214 which may be arranged rotationally symmetrical about the first conductive element 212 (e.g., with respect to the axis 213 or the central longitudinal axis of the first conductive element 212). The second conductive element 214 may be arranged rotationally symmetrical about the axis 213. The second conductive element 214 may surround the first conductive element 212. The first conductive element 212 may be an on-axis conductive element, while the second conductive element 214 may be an off-axis conductive element. In various embodiments, the first conductive element 212 may be an elongate conductive element extending along the axis 213. In various embodiments, each of the first conductive element 212 and the second conductive element 214 may be cylindrical. Each of the first conductive element 212 and the second conductive element 214 may have a circular cross-section.

In various embodiments, the first conductive element 212 may be centrally positioned in the aberration correction unit 210, for example, the first conductive element 212 may be positioned along a central axis (e.g., axis 213) of the aberration correction unit 210.

In various embodiments, the first conductive element 212 and the second conductive element 214 may be arranged overlapping with each other.

In various embodiments, a central point or central axis of the second conductive element 214 may be coaxial with the axis 213. This may mean that the axis 213 along which the first conductive element 212 extends may also define the central axis of the second conductive element 214.

The aberration correction unit 210 may be arranged to propagate an annular beam 204 having charged particles 206 in between the first conductive element 212 and the second conductive element 214 such that propagation of the annular beam 204 through the aberration correction unit 210 may be rotationally symmetrical about the first conductive element 212 (e.g., the annular beam 204 may be rotationally symmetrical about the axis 213 or the central longitudinal axis of the first conductive element 212).

In various embodiments, the axis 213 may be a focus axis for the annular beam 204, meaning that the annular beam 204 may be subsequently focused (for example, by a lens arrangement) into a probe beam at a location on the focus axis 213.

In various embodiments, the aberration correction unit 210 may be configured to generate a (radial) magnetic field force, $F_m$, 216a between the first conductive element 212 and the second conductive element 214 (e.g., in response to a current, I, received by one of the first conductive element 212 or the second conductive element 214, which may generate a (radial) magnetic field to generate the magnetic field force, $F_m$ 216a). As a non-limiting example, the magnetic field force 216a may be generated in response to the current, I, received by the conductive element (either the first conductive element 212 or the second conductive 214) and may extend in a radial direction relative to the conductive element receiving the current, I. The magnetic field force 216a may be a Lorentz force.

In various embodiments, the aberration correction unit 210 may be configured to generate an (radial) electric field force, $F_e$, 216b between the first conductive element 212 and the second conductive element 214 (e.g., in response to a potential difference generated between the first conductive element 212 and the second conductive element 214, which may generate a (radial) electric field to generate the electric field force, $F_e$ 216b). The electric field force 216b may be generated, for example, by the application of a voltage, $V_C$, to the second conductive element 214 such that the second conductive element 214 may be at a potential level different from that of the first conductive element 212. In various embodiments, the first conductive element 212 may be at ground level or at 0 V.

In various embodiments, the magnetic field force, $F_m$, 216a and the electric field force, $F_e$, 216b may overlap each other. The magnetic field force, $F_m$, 216a and the electric field force, $F_e$, 216b may be directed in opposite directions and superimposed on each other to act on the charged particles 206 to change a trajectory or propagation path of the charged particles 206. This may mean that the magnetic field force 216a may be directed in a first (radial) direction and the electric field force 216b may be directed in a second (radial) direction opposite to the first direction. It should be appreciated that the magnetic field force 216a and the electric field force 216b may be directed in opposite directions, in all radial directions. In various embodiments, the magnetic field force, $F_m$, 216a and the electric field force, $F_e$, 216b may co-operate to generate a resultant (or effective) force acting on the charged particles to change a trajectory of at least some of the charged particles. Accordingly, it should be appreciated that the aberration correction unit 210 may function by superimposing opposing radial magnetic and electric fields 216a, 216b.

The aberration correction apparatus 200 may further include an annular aperture (e.g., 202) optically coupled to the aberration correction unit 210.

In various embodiments, the annular aperture (e.g., 202) may be arranged after the aberration correction unit 210 or at the output side of the aberration correction unit 210. This may mean that the annular aperture may receive the annular beam 204 after propagation through the aberration correction unit 210. In this way, charged particles 206 of the annular beam 204 at radial distances (relative to the first conductive element 212) corresponding to the annular aperture may pass through or be transmitted through the annular aperture.

In various embodiments, for example, when the annular aperture is arranged after the aberration correction unit 210, a beam (e.g., a full beam) may be provided to the aberration correction unit 210. The beam may be shaped into the annular beam 204 by the first conductive element 212 and the second conductive element 214 when propagating through the aberration correction unit 210. This may mean that a central portion of the beam received by the aberration correction unit 210 may be blocked by the first conductive element 212 such that an inner boundary of the annular beam 204 may be defined by the first conductive element 212. An outer boundary of the annular beam 204 may be defined by the second conductive element 214.

In various embodiments, the annular aperture 202 may be arranged to generate the annular beam 204 for propagation through the aberration correction unit 210. This may mean that the annular aperture 202 may be arranged before the aberration correction unit 210 or at the input side of the aberration correction unit 210, as shown in FIG. 2A. As a non-limiting example, the annular aperture 202 may receive a beam 203 of the charged particles 206. Part of the beam 203 may pass through the annular aperture 202 so as to generate or transmit the annular beam 204 having the charged particles 206. This may mean that the annular aperture 202 may generate the annular beam 204 at its output from the beam 203 received at its input. The aberration correction unit 210 optically coupled to the annular aperture 202 may then receive the annular beam 204.

In various embodiments, the annular aperture 202 may form part of the aberration correction unit 210 or may be external to the aberration correction unit 210.

In various embodiments, the annular aperture 202 may provide a higher area for the transmission of charged particles 206 compared to a conventional hole aperture.

In the context of various embodiments, the term "annular" may mean ring-shaped, and may be defined by an inner radius and an outer radius relative to a common point (e.g., common central point). Therefore, the annular aperture 202 may mean an opening or aperture that may be transmissive to the charged particles 206, the aperture 202 having an inner boundary defined by an inner radius, $r_{inner}$, and an outer boundary defined by an outer radius $r_{outer}$, while a substantially central portion bounded by the inner radius, $r_{inner}$, that may be non-transmissive to the charged particles 206.

In the context of various embodiments, the term "optically coupled" as used herein in relation to two structures (or elements) may mean that the two structures may be arranged such that the charged particles 206 or the annular beam 204 may propagate through the two structures, or may propagate from one structure to the other structure. This may mean that the first structure may be arranged to receive the charged particles 206 or the annular beam 204 after propagating through the second structure, or the first structure may be arranged to provide the charged particles 206 or the annular beam 204 to the second structure after propagating through the first structure.

In the context of various embodiments, the term "rotationally symmetrical" may mean radially symmetrical, for example about a structure (which may be the first conductive element 212 in various embodiments) or about an axis (which may be the axis 213 in various embodiments, where the axis 213 may be a central axis of the annular beam 204).

For example, a second structure (or element) that is rotationally symmetrical about a first structure (or element) may mean that a circumferential perimeter or boundary or surface (e.g., a peripheral surface) defined or traced on the second structure may be radially symmetrical about the first structure. In other words, the circumferential perimeter (or boundary or surface) on the second structure may be defined by the same radius or radial distance relative to the first structure, or a radial distance defined from the first structure to the circumferential perimeter (or boundary or surface) of the second structure is the same in all radial directions relative to the first structure. All circumferential perimeters or boundaries or surfaces (e.g., peripheral surfaces) defined or traced on the second structure may be radially symmetrical about the first structure. This may mean that, a central axis of the first structure may be aligned coaxially with a central axis of the second structure.

As illustrated in FIG. 2A, the second conductive element 214, which may be arranged rotationally symmetrical about the first conductive element 212, may have its inner peripheral surface or circumference at a radial distance, $r_3$, relative to the axis 213.

As also illustrated in FIG. 2A, rings or concentric rings defined or traced in the annular beam 204, which propagation through the aberration correction unit 210 may be rotationally symmetrical about the first conductive element 212, may be radially symmetrical about the first conductive element 212. For example, after being transmitted through the annular aperture 202, the innermost ring or boundary of the annular beam 204, nearest to the first conductive element 212, may be at a radial distance, $r_1$, relative to the axis 213, while the outermost ring or boundary of the annular beam 204, furthest from the first conductive element 212, may be at a radial distance, $r_2$, relative to the axis 213.

In various embodiments, the aberration correction unit 210 may be employed for addressing or correcting an (geometrical) aberration (or aberration characteristic) of the charged particles 206 (comprised in the annular beam 204).

In various embodiments, the aberration correction unit 210 may compensate for chromatic aberration that may be experienced by the charged particles 206 when propagating through a lens arrangement optically coupled to the aberration correction unit 210. For example, the lens arrangement may be configured to focus the annular beam 204. For example, a chromatic (aberration) characteristic associated with the annular beam 204 or the charged particles 206 may be changed to address or compensate for the chromatic aberration experienced by the charged particles 206 when propagating or passing through a (focusing) lens arrangement.

In various embodiments, the aberration correction unit 210 may be configured to generate the magnetic field force 216a in response to a current, I, received by the first conductive element 212 such that the magnetic field force 216a may be in a direction from the second conductive element 214 to the first conductive element 212 (e.g., radially inwards to the first conductive element 212). The magnetic field force 216a may act in a radial direction from the second conductive element 214 to the first conductive element 212. The magnetic field force 216a may act in all radial directions from the second conductive element 214 to the first conductive element 212. The magnetic field force 216a generated may be rotationally symmetrical about the first conductive element 212 or the axis 213.

In various embodiments, the aberration correction unit 210 may be configured to generate the electric field force 216b in response to a potential difference generated between the first conductive element 212 and the second conductive element 214 such that the electric field force 216b may be in a direction from the first conductive element 212 to the second conductive element 214 (e.g., radially outwards from the first conductive element 212). The electric field force 216b may act in a radial direction from the first conductive element 212 to the second conductive element 214. The electric field force 216b may act in all radial directions from the first conductive element 212 to the second conductive element 214. The electric field force 216b generated may be rotationally symmetrical about the first conductive element 212 or the axis 213. As a non-limiting example, the first conductive element 212 may be maintained at ground or 0V, and a (corrector) voltage, $V_C$, may be applied to the second conductive element 214 so as to generate a potential difference between the first conductive element 212 and the second conductive element 214 to generate the electric field force 216b.

In various embodiments, out of (or from) the charged particles 206 comprised in the annular beam 204, for a first charged particle having a first velocity, $v_1$, the magnetic field force 216a and the electric field force 216b may co-operate to generate a first (radial) resultant (or effective) force acting on the first charged particle to change a trajectory (or propagation path) of the first charged particle towards the first conductive element 212 (or towards the axis 213). This may mean that the first resultant force may provide a converging effect or action, to converge the first charged particle towards the first conductive element 212 or the axis 213.

In various embodiments, out of (or from) the charged particles 206 comprised in the annular beam 204, for a second charged particle having a second velocity, $v_2$, different from the first velocity, $v_1$, the magnetic field force 216a and the electric field force 216b may co-operate to generate a second (radial) resultant (or effective) force acting on the second charged particle to change a trajectory (or propagation path) of the second charged particle away from the first conductive element 212 (or away from the axis 213). This may mean that the second resultant force may provide a diverging effect or action, to diverge the second charged particle away from the first conductive element 212 or the axis 213.

In various embodiments, the first velocity, $v_1$, may be higher than the second velocity, $v_2$, such that the first charged particle may have a faster velocity, and therefore, a higher energy, compared to the second charged particle.

In various embodiments, the first velocity, $v_1$, of the first charged particle may be higher than the second velocity, $v_2$, of the second charged particle, wherein the first resultant force acting on the first charged particle may include a net magnetic field force ($F_m > F_e$) acting on the first charged particle, and wherein the second resultant force acting on the second charged particle may include a net electric field force ($F_m < F_e$) acting on the second charged particle.

In various embodiments, the charged particles 206 (e.g., comprised in the annular beam 204) may have a spread of velocities around or centred on a central velocity, with some charged particles (e.g., faster charged particles or electrons) having a velocity higher than the central velocity, and with some other charged particles (e.g., slower charged particles or electrons) having a velocity lower than the central velocity. The spread in the velocities of the charged particles 206 may follow a Gaussian function or distribution.

In various embodiments, the first velocity, $v_1$, may be higher than the central velocity of the charged particles 206, while the second velocity, $v_2$, may be lower than the central velocity of the charged particles 206.

In various embodiments, the strength of the magnetic field force 216a acting on a charged particle may depend on the velocity of the charged particle.

In various embodiments, for a charged particle having a central velocity, the strength of the magnetic field force 216a acting on or experienced by the charged particle may be at least substantially equal to the strength of the magnetic field force 216a ($F_m=F_e$) acting on or experienced by the charged particle.

In various embodiments, for a charged particle (e.g., electron) having a velocity higher than the central velocity, and therefore having higher energy, the strength of the magnetic field force 216a acting on or experienced by the charged particle may be higher than the strength of the electric field force 216b ($F_m>F_e$) acting on or experienced by the charged particle. The charged particle may be overfocused due to a convergent effect caused by $F_m>F_e$.

In various embodiments, for a charged particle (e.g., electron) having a velocity lower than the central velocity, and therefore having lower energy, the strength of the magnetic field force 216a acting on or experienced by the charged particle may be lower than the strength of the electric field force 216b ($F_m<F_e$) acting on or experienced by the charged particle. The charged particle may be underfocused due to a divergent effect caused by $F_m<F_e$.

In various embodiments, the aberration correction unit 210 (e.g., as a chromatic aberration correction unit) may function by cancelling the electric force 216b with the magnetic force 216a for charged particles (e.g., electrons) 206 travelling at the central velocity. Rays or charged particles 206 travelling at the central velocity therefore may not experience a significant force. On the other hand, by the action Lorentz Force, charged particles (e.g., electrons) 206 travelling at a faster velocity than the central velocity, may experience a converging magnetic force, while slower charged particles (e.g., electrons) 206 travelling at a slower velocity than the central velocity may experience a diverging force. This action by the aberration correction unit 210 is in opposition to the way an objective lens focuses an electron beam, where it has less of convergent action on the faster electrons, and a stronger converging action on the slower electrons.

In the context of various embodiments, the first conductive element 212 may have a diameter of between about 50 µm and about 1 mm (1000 µm), for example, between about 50 µm and about 500 µm, between about 50 µm and about 200 µm, between about 50 µm and about 100 µm, between about 200 µm and about 1000 µm, between about 500 µm and about 1000 µm, or between about 100 µm and about 500 µm.

In the context of various embodiments, the first conductive element 212 may have a length of between about 1 mm and about 50 mm, for example, between about 1 mm and about 30 mm, between about 1 mm and about 10 mm, between about 10 mm and about 50 mm, between about 20 mm and about 50 mm, or between about 10 mm and about 30 mm.

In various embodiments, the first conductive element 212 may have a central longitudinal axis (e.g., axis 213), and wherein the annular aperture 202 may be arranged rotationally symmetrical about the central longitudinal axis. The central longitudinal axis of the first conductive element 212 may mean the longitudinal axis of the first conductive element 212 defined through the central point of the first conductive element 212. The first conductive element 212 may extend along the central longitudinal axis.

In the context of various embodiments, the annular aperture 202 may be defined by an inner radius, $r_{inner}$, of between about 10 µm and about 70 µm and an outer radius, $r_{outer}$, of between about 20 µm and about 80 µm. For example, the inner radius, $r_{inner}$, may be between about 10 µm and about 50 µm, between about 10 µm and about 30 µm, or between about 30 µm and about 70 µm. The outer radius, $r_{outer}$, may be between about 20 µm and about 60 µm, between about 20 µm and about 40 µm, or between about 40 µm and about 80 µm. As non-limiting examples, the annular aperture 202 may have a configuration of "inner radius–outer radius" ($r_{inner}$–$r_{outer}$) of 10 µm-20 µm, 30 µm-40 µm, 50 µm-60 µm, or 70 µm-80 µm. The outer radius, $r_{outer}$, is larger than the inner radius, $r_{inner}$. The distance between the outer radius and the inner radius defines the width of the annular aperture 202. In the context of various embodiments, the annular aperture 202 may have a width of about 10 µm. However, it should be appreciated that other values may be employed for the inner radius and the outer radius of the annular aperture 202, for example up to and in the range of millimeters (mm).

In various embodiments, the aberration correction apparatus 200 may further include an additional aberration correction unit optically coupled to the aberration correction unit 210. The additional aberration correction may be configured to change a trajectory of the charged particles 206. The additional aberration correction unit may be configured to generate an additional (radial) electric field force or an additional (radial) magnetic field force to act on the charged particles 206 to change a trajectory of the charged particles 206. In this way, the additional aberration correction unit may function either by generating a magnetic or electric radial field. The additional aberration correction unit may be arranged directly before or directly after the aberration correction unit 210. In various embodiments, a trajectory of the charged particles 206 may be changed by the aberration correction unit 210 as well as by the additional aberration correction unit.

In various embodiments, the additional aberration correction unit may be employed for addressing or correcting an aberration (characteristic) of the charged particles 206 (comprised in the annular beam 204). The additional aberration correction unit may compensate for spherical aberration that may be experienced by the charged particles 206 when propagating through a lens arrangement optically coupled to the additional aberration correction unit. For example, the lens arrangement may be configured to focus the annular beam 204. For example, a spherical (aberration) characteristic associated with the annular beam 204 or the charged particles 206 may be changed to address or compensate for the spherical aberration experienced by the charged particles 206 when propagating or passing through a (focusing) lens arrangement.

In various embodiments, a longitudinal dimension (or length) of the aberration correction unit 210 may be larger than a longitudinal dimension (or length) of the additional aberration correction unit.

In various embodiments, the additional aberration correction unit may include a first conductive member (e.g., central conductive wire or central wire conductor), and a second conductive member (e.g., (outer) tube conductor) arranged rotationally symmetrical about the first conductive member, wherein the additional aberration correction unit may be arranged to propagate the annular beam 204 between the first conductive member and the second conductive member such that propagation of the annular beam 204 through the additional aberration correction unit may be rotationally symmetrical about the first conductive member, and wherein the additional aberration correction unit may be configured to generate an additional (radial) electric field force between the first conductive member and the second conductive member to act on the charged particles 206 to change a trajectory of the charged particles 206. In this way, the additional aberration correction unit may be an electric or electrostatic correction unit.

The first conductive member may extend along an axis, e.g., corresponding to or coaxial with a central longitudinal axis of the first conductive member. The central longitudinal axis of the first conductive member may coincide or may be coaxial with the axis 213. The second conductive member may be arranged rotationally symmetrical about the central longitudinal axis of the first conductive member. The first conductive member may be an on-axis conductive member, while the second conductive member may be an off-axis conductive member.

The additional electric field force may be in a radial direction between the first conductive member and the second conductive member. The additional electric field force may be in a (radial) direction from the second conductive member towards the first conductive member.

In various embodiments, the strength of the additional electric field force may decrease in a direction away from the first conductive member. In this way, charged particles 206 at different radial positions relative to the first conductive member may experience different strengths of the additional electric field force. For example, a charged particle at a radial position proximal to the first conductive member may experience a larger electric field force strength compared to a charged particle at a radial position distal to the first conductive member. As a non-limiting example, a charged particle at a radial position proximal to the first conductive member may experience over focusing by the additional electric field force acting on said charged particle, while a charged particle at a radial position distal to the first conductive member may experience under focusing by the additional electric field force acting on said charged particle.

In various embodiments, the additional electric field force may be generated in response to a potential difference generated between the first conductive member and the second conductive member, which may generate a (radial) electric field to generate the electric field force. As a non-limiting example, the first conductive member may be maintained at ground or 0V, and a (corrector) voltage, $V_C$, may be applied to the second conductive member so as to generate a potential difference between the first conductive member and the second conductive member to generate the additional (radial) electric field force.

In various embodiments, a longitudinal dimension (or length) of the first conductive element 212 of the aberration correction unit 210 may be larger than a longitudinal dimension (or length) of the first conductive member of the additional aberration correction unit.

In various embodiments, the additional aberration correction unit may include a conductor (e.g., central conductive wire or central wire conductor), wherein the additional aberration correction unit may be arranged to propagate the annular beam 204 such that propagation of the annular beam 204 through the additional aberration correction unit may be rotationally symmetrical about the conductor, and wherein the additional aberration correction unit may be configured to generate an additional (radial) magnetic field force to act on the charged particles to change a trajectory of the charged particles 206. In this way, the additional aberration correction unit may be a magnetic correction unit.

The conductor may extend along an axis, e.g., corresponding to or coaxial with a central longitudinal axis of the conductor. The central longitudinal axis of the conductor may coincide or may be coaxial with the axis 213. The conductor may be an on-axis conductor.

The additional magnetic field force may be in a radial direction relative to the conductor. The additional magnetic field force may be in a (radial) direction towards the conductor.

In various embodiments, the strength of the additional magnetic field force may decrease in a direction away from the conductor. In this way, charged particles 206 at different radial positions relative to the conductor may experience different strengths of the additional magnetic field force. For example, a charged particle at a radial position proximal to the conductor may experience a larger magnetic field force strength compared to a charged particle at a radial position distal to the conductor. As a non-limiting example, a charged particle at a radial position proximal to the conductor may experience over focusing by the additional magnetic field force acting on said charged particle, while a charged particle at a radial position distal to the conductor may experience under focusing by the additional magnetic field force acting on said charged particle.

In various embodiments, the additional magnetic field force may be generated in response to a current, I, received by the conductor, which may generate an additional (radial) magnetic field force ($B_\theta$) to generate the magnetic field force.

In various embodiments, a longitudinal dimension (or length) of the first conductive element 212 of the aberration correction unit 210 may be larger than a longitudinal dimension (or length) of the conductor of the additional aberration correction unit.

In various embodiments, a (corrector) voltage, $V_C$, applied to the second conductive element 214 of the aberration correction unit 210 may be different to the (corrector) voltage, $V_C$, that may be applied to the second conductive member of the additional aberration correction unit.

In the context of various embodiments, the aberration correction apparatus 200 including the aberration correction unit 210 and the additional aberration correction unit may enable simultaneous correction of chromatic aberration and spherical aberration related to or associated with the charged particles 206. In various embodiments, the aberration correction unit 210 may be a chromatic aberration correction unit or chromatic corrector unit, while the additional aberration correction unit may be a spherical aberration correction unit or spherical corrector unit.

In the context of various embodiments, it should be appreciated that for a charged particle of a particular sign (e.g., positively changed or negatively charged), the charged particle may experience a divergent effect or a convergent effect depending on the polarity or sign of the voltage, $V_C$, applied.

In the context of various embodiments, it should be appreciated that for a voltage, $V_C$, of a particular polarity or sign (e.g, positive or negative) that is applied, a charged particle may experience a divergent effect or a convergent effect depending on the polarity of the charged particle.

In the context of various embodiments, the charged particles 206 may include electrons (e.g., the beam 203 and the annular beam 204 may be an electron beam) or ions (e.g., the beam 203 and the annular beam 204 may be an ion beam, for example, a positively charged ion beam or a negatively charged ion beam).

Figure 2B:
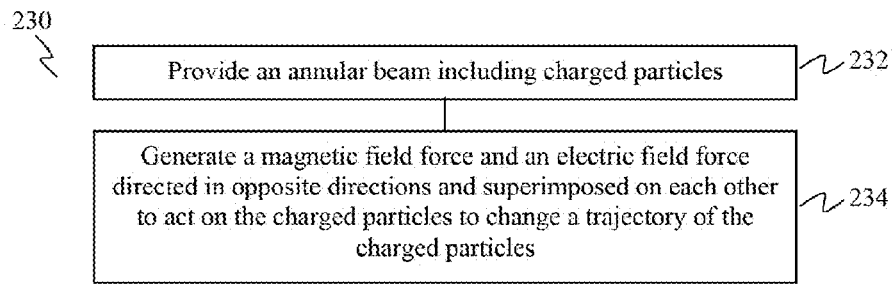
FIG. 2B shows a flow chart illustrating a method for correcting aberration of charged particles, according to various embodiments.

FIG. 2B shows a flow chart 230 illustrating a method for correcting (geometrical) aberration of charged particles, according to various embodiments.

At 232, an annular beam is provided, the annular beam including charged particles.

At 234, a magnetic field force, $F_m$, and an electric field force, $F_e$, are generated, directed in opposite directions and superimposed on each other to act on the charged particles to change a trajectory of the charged particles. The magnetic field force may be a radial magnetic field force and the electric field force may be a radial electric field force, meaning that the magnetic field force and the electric field force may act in opposite radial directions. The magnetic field force and an electric field force generated may be directed across the annular beam. The magnetic field force and the electric field force generated may act on the charged particles to correct for a chromatic aberration associated with the charged particles.

In various embodiments, at 232, the method may include propagating the annular beam through an aberration correction unit in between a first conductive element of the aberration correction unit and a second conductive element of the aberration correction unit, wherein the second conductive element may be arranged rotationally symmetrical about the first conductive element, and wherein propagation of the annular beam through the aberration correction unit may be rotationally symmetrical about the first conductive element, and at 234, the magnetic field force and the electric field force may be generated between the first conductive element and the second conductive element.

In various embodiments, the magnetic field force, $F_m$, between the first conductive element and the second conductive element may be generated by applying a current, I, to the first conductive element such that the magnetic field force, $F_m$, may be in a direction from the second conductive element to the first conductive element.

In various embodiments, the electric field force, $F_e$, between the first conductive element and the second conductive element may be generated by generating a potential difference between the first conductive element and the second conductive element such that the electric field force, $F_e$, may be in a direction from the first conductive element to the second conductive element.

In various embodiments, out of the charged particles comprised in the annular beam, for a first charged particle having a first velocity, $v_1$, the magnetic field force, $F_m$, and the electric field force, $F_e$, may co-operate to generate a first resultant force acting on the first charged particle to converge the first charged particle (e.g., towards the first conductive element), and wherein, out of the charged particles comprised in the annular beam, for a second charged particle having a second velocity, $v_2$, different from the first velocity, $v_1$, the magnetic field force, $F_m$, and the electric field force, $F_e$, may co-operate to generate a second resultant force acting on the second charged particle to diverge the second charged particle (e.g., away from the first conductive element).

The first velocity, $v_1$, of the first charged particle may be higher than the second velocity, $v_2$, of the second charged particle (i.e., $v_1 > v_2$), wherein the first resultant force acting on the first charged particle may include a net magnetic field force acting on the first charged particle, and wherein the second resultant force acting on the second charged particle may include a net electric field force acting on the second charged particle.

In various embodiments, the method may further include correcting for a spherical aberration associated with the charged particles. For example, this may include changing a trajectory of the charged particles.

Figure 2C:
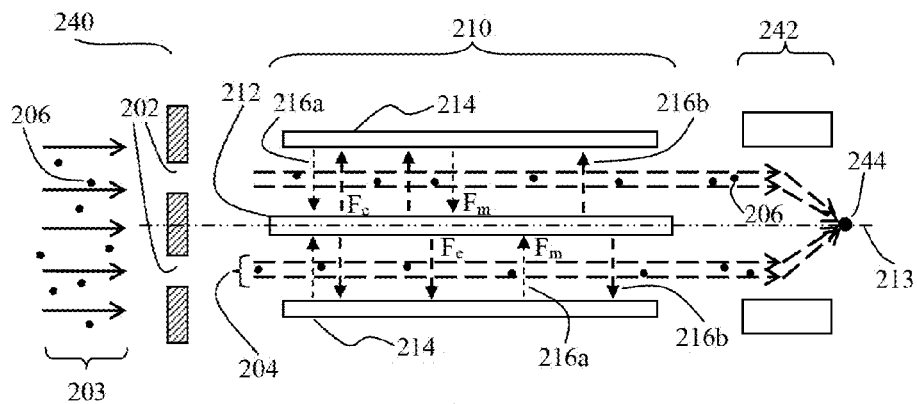
FIG. 2C shows a schematic cross-sectional view of a device employing charged particles, according to various embodiments.

FIG. 2C shows a schematic cross-sectional view of a device 240 employing charged particles, according to various embodiments. The device 240 includes an aberration correction unit 210 including a first conductive element 212, and a second conductive element 214 arranged rotationally symmetrical about the first conductive element 212, wherein the aberration correction unit 210 is arranged to propagate an annular beam 204 having charged particles 206 in between the first conductive element 212 and the second conductive element 214 such that propagation of the annular beam 204 through the aberration correction unit 210 is rotationally symmetrical about the first conductive element 212, and wherein the aberration correction unit 210 is configured to generate, between the first conductive element 212 and the second conductive element 214, a magnetic field force 216a and an electric field force 216b directed in opposite directions and superimposed on each other to act on the charged particles 206 to change a trajectory of the charged particles 206, an annular aperture 202 optically coupled to the aberration correction unit 210; and a lens arrangement 242 optically coupled to the aberration correction unit 210.

In various embodiments, the annular aperture 202 may be arranged to generate the annular beam 204 for propagation through the aberration correction unit 210. This may mean that the annular aperture 202 may be arranged before the aberration correction unit 210 or at the input side of the aberration correction unit 210, as shown in FIG. 2C. However, it should be appreciated that the annular aperture 202 may be arranged after the aberration correction unit 210 or at the output side of the aberration correction unit 210.

In various embodiments, the lens arrangement 242 may be arranged after the aberration correction unit 210.

In various embodiments, the lens arrangement 242 may be configured to focus the annular beam 204 to form a probe beam 244.

In various embodiments, the lens arrangement 242 may be an electric lens arrangement or a magnetic lens arrangement.

In various embodiments, out of (or from) the charged particles 206 comprised in the annular beam 204, for a first charged particle having a first velocity, $v_1$, the magnetic field force 216a and the electric field force 216b may co-operate to generate a first (radial) resultant (or effective) force acting on the first charged particle to change a trajectory (or propagation path) of the first charged particle towards the first conductive element 212 (or towards the axis 213). This may mean that the first resultant force may provide a converging effect or action, to converge the first charged particle towards the first conductive element 212 or the axis 213.

In various embodiments, out of (or from) the charged particles 206 comprised in the annular beam 204, for a second charged particle having a second velocity, $v_2$, different from the first velocity, $v_1$, the magnetic field force 216a and the electric field force 216b may co-operate to generate a second (radial) resultant (or effective) force acting on the second charged particle to change a trajectory (or propagation path) of the second charged particle away from the first conductive element 212 (or away from the axis 213). This may mean that the second resultant force may provide a diverging effect or action, to diverge the second charged particle away from the first conductive element 212 or the axis 213. In various embodiments, the first velocity, $v_1$, may be higher than the second velocity, $v_2$, such that the first charged particle may have a faster velocity, and therefore, a higher energy, compared to the second charged particle.

In various embodiments, the device 240 may further include a spherical aberration correction unit optically coupled to the aberration correction unit 210.

It should be appreciated that the annular aperture 202 and the aberration correction unit 210, including their respective configurations or structures, relative arrangements and operations, may be as described in the context of the aberration correction apparatus 200.

It should be appreciated that the spherical aberration correction unit, including its configuration or structures, arrangement relative to the other structures of the device 240, and operations, may be as described in the context of the additional aberration correction unit of the aberration correction apparatus 200.

In various embodiments, the device 240 may be a microscopy device.

In various embodiments, the device 240 may include a helium ion microscope, a focused ion beam column or microscope, a high voltage electron beam lithography device or an electron microscope such as a scanning transmission electron microscope.

The on-axis electrode corrector concept, for example, for application in electron microscopes will now be described.

Various embodiments, for example as disclosed herein, may provide annular electron microscope designs based upon using wider off-axis electrons in the primary beam. These wider off-axis electrons may typically be blocked by a final hole aperture in a conventional scanning electron microscope (SEM). However, in various embodiments, from a crossover point 301, the electrons may go through an annular aperture 304 to form an annular electron beam 304, and then on into an aberration correction unit 310 (or corrector unit or corrector lens unit) that may have an electrode or wire 312 placed at its centre (for example, along the axis 313), as shown in a schematic diagram of FIG. 3 for a final stage 300 of a probe forming electron/ion microscope with an on-axis aberration corrector (e.g., an on-axis spherical aberration corrector) 310. The annular aperture 304 may be part of the aberration correction unit 310 or may be external to the aberration correction unit 310. In various embodiment, the probe current may increase due to an increase in the transmission area in the annular aperture 302, as compared to a hole aperture.

The on-axis electrode/wire 312 may be able to create field conditions which correct for the spherical aberration of the objective lens 306, while the annular aperture 302 may provide a much higher area for the transmission of the electron beam 303 than a conventional hole aperture (e.g., as in FIG. 1). There may be a tube conductor 314 rotationally symmetrical about the electrode/wire 312. The objective lens 306 may be an electric lens. The objective lens 306 may include three electrodes 320a, 320b, 320c where the electrodes 320a, 320c may be maintained at 0V while a voltage, $V_F$, may be applied to the electrode 320b. The objective lens 306 may focus the (annular) electron beam 304 towards a focal point 308 to form a probe beam, for example, by controlling the voltages of the electrodes 320a, 320b, 320c. This arrangement may therefore be able to combine high spatial resolution with high probe current, something that is not possible to achieve in conventional scanning electron microscopes (SEMs).

Figure 3:
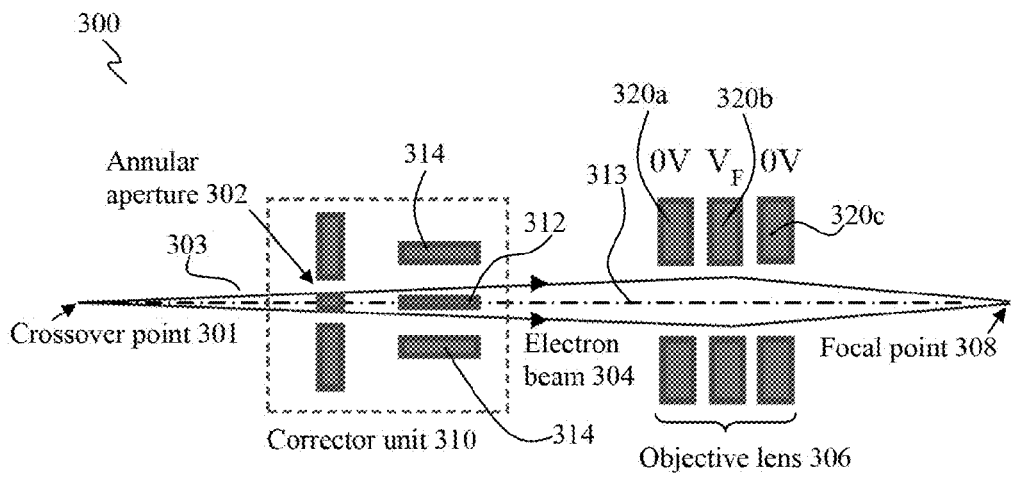
FIG. 3 shows a schematic side view of one example of a final stage of an electron microscope with an on-axis aberration corrector, according to various embodiments.
Figure 4A:
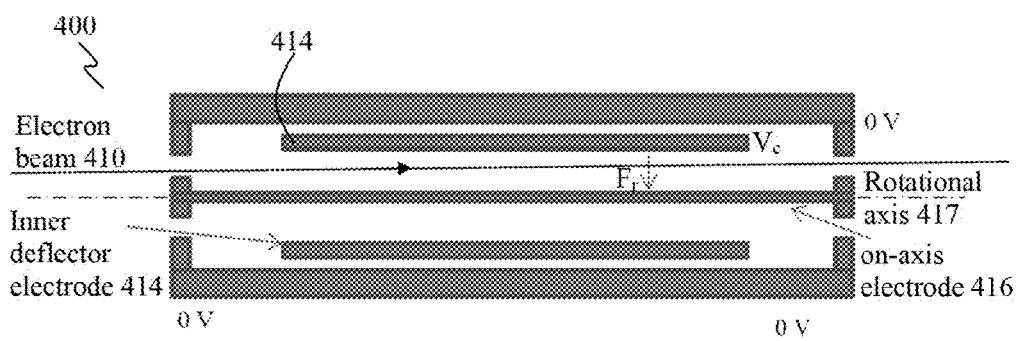
FIG. 4A shows a schematic cross-sectional view of an on-axis corrector layout (electrostatic), according to various embodiments.
Figure 4B:
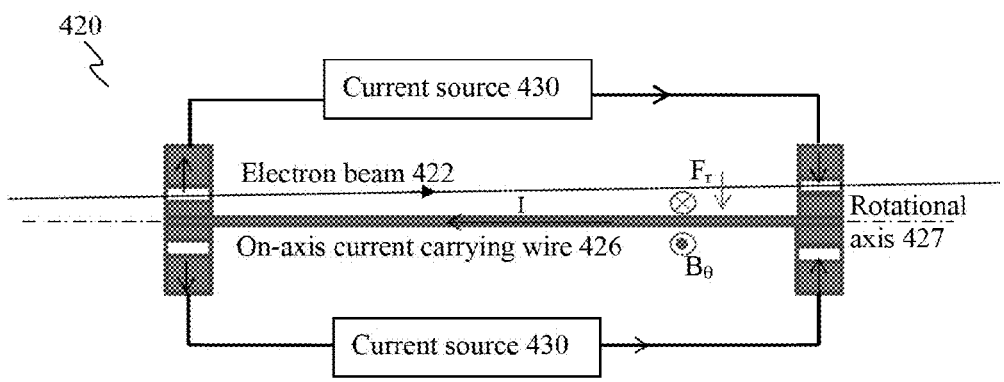
FIG. 4B shows a schematic cross-sectional view of an on-axis corrector layout (magnetic), according to various embodiments.

FIGS. 4A and 4B show schematic cross-sectional views for an electric (electrostatic) corrector unit 400 (e.g., an electric design for a spherical aberration on-axis electrode corrector) and a magnetic corrector unit 420 (e.g., a magnetic design for a spherical aberration on-axis electrode corrector), respectively, in accordance with various embodiments. An aberration correction apparatus (e.g., 310, FIG. 3), in accordance with various embodiments, may include an annular aperture (not shown in FIGS. 4A and 4B; see annular aperture 302, FIG. 3) and an aberration correction unit 400, 420.

In the electric corrector case (e.g., the on-axis electrode spherical aberration electrostatic correction unit 400) as shown in FIG. 4A, the electrostatic corrector unit 400 may be similar to a coaxial cable layout with a zero volt on-axis wire electrode (e.g., first conductive member) 416, where the electric field, neglecting the end fringe field effects, may be inversely proportional to the radius. A coaxial radial electric field $E_r$, may be created between the on-axis electrode 416 (e.g., a 0 volt on-axis electrode or first conductive member) and a deflector tube (e.g., an inner deflector electrode 414, e.g., second conductive member) with a corrector voltage, $V_C$. The radius of the central electrode 416 may typically vary between 20 to 100 μm, and it may be held at the centre, along a rotational axis 417 of the electrostatic correction unit 400, by radial supports at the ends of the corrector 400 in field free regions (not shown in FIG. 4A). The whole assembly may be several millimeters long. One possible way of fabricating the correction unit 400 may be through microelectromechanical systems (MEMS) technology. The radial electric field inside the corrector 400 may generate a radial force $F_r$ on the electron beam 410 that travels through the corrector 400. While one electron path (represented by beam 410) is shown in FIG. 4A through the upper half of the corrector 400, it should be appreciated that the beam 410 also propagates through the lower half of the corrector 400. For example, the beam 410 may be rotationally symmetrical about the on-axis electrode 416. In various embodiments, the spherical (S) aberration associated with the electron beam 410 may be decreased by the electric corrector unit 400.

The magnetic corrector unit (e.g., the on-axis electrode spherical aberration magnetic correction unit 420) shown in the schematic drawing of FIG. 4B, also has a wire (e.g., an on-axis current carrying wire 426; conductor) at its centre (along a rotational axis 427 of the corrector 420), only in this case, the wire 426 carries a current I, which generates a magnetic field around the wire (e.g., shown as a tangential magnetic field $B_\theta$ in the schematic view of FIG. 4B). In other words, the on-axis current carrying wire 426 may generate a circular magnetic field (Ampere's Law) whose strength may also be inversely proportional to the radius.

The subsequent Lorentz force on the electron beam 422 in the magnetic corrector 420 may be a radial one, $F_r$, as in the electric corrector case. At the ends of the magnetic corrector 420, current may travel through radial spoke conductors (not shown) to a current source 430. While two current sources are shown in FIG. 4B as FIG. 4B illustrates a cross-sectional view, it should be appreciated that the two current sources 430 essentially represent one current source that is rotationally symmetrical about the wire 426. The end radial effects on the electron beam 420 may be expected to cancel out, since the radial currents at both ends of the magnetic corrector are in opposite directions to one another. While one electron path (represented by beam 422) is shown in FIG. 4B through the upper half of the corrector 420, it should be appreciated that the beam 422 also propagates through the lower half of the corrector 420. For example, the beam 422 may be rotationally symmetrical about the conductor 426. In various embodiments, the spherical (S) aberration associated with the electron beam 420 may be decreased by the magnetic corrector unit 420.

For both the electric and magnetic correctors 400, 420, the effects of fringe fields at their ends may be minimised by making the path length through them to be small in comparison to the path length of the main correction field. In both cases, the strength of the corrector unit focusing lens action applied to the primary electron/ion beam may decrease as a function of radius, opposite to the over-focusing action of the objective lens, whose strength increases with radius. In this way, the spherical aberration effect of an objective lens be reduced. These correctors (e.g., 400, 420) more effective with decreasing annular aperture width. Whether the corrector requires a divergent or convergent action on the primary beam depend on the incoming angle of the primary beam and the working distance, however, this not the key to understanding the way the corrector compensates for the spherical aberration compensation achieved by falling field strength as a function of radius. The correctors 400, 420 shown in FIGS. 4A and 4B may have applications in situations where spherical aberration may be dominant (low diffraction and chromatic aberrations), such as in a helium ion microscope.

Figure 5:
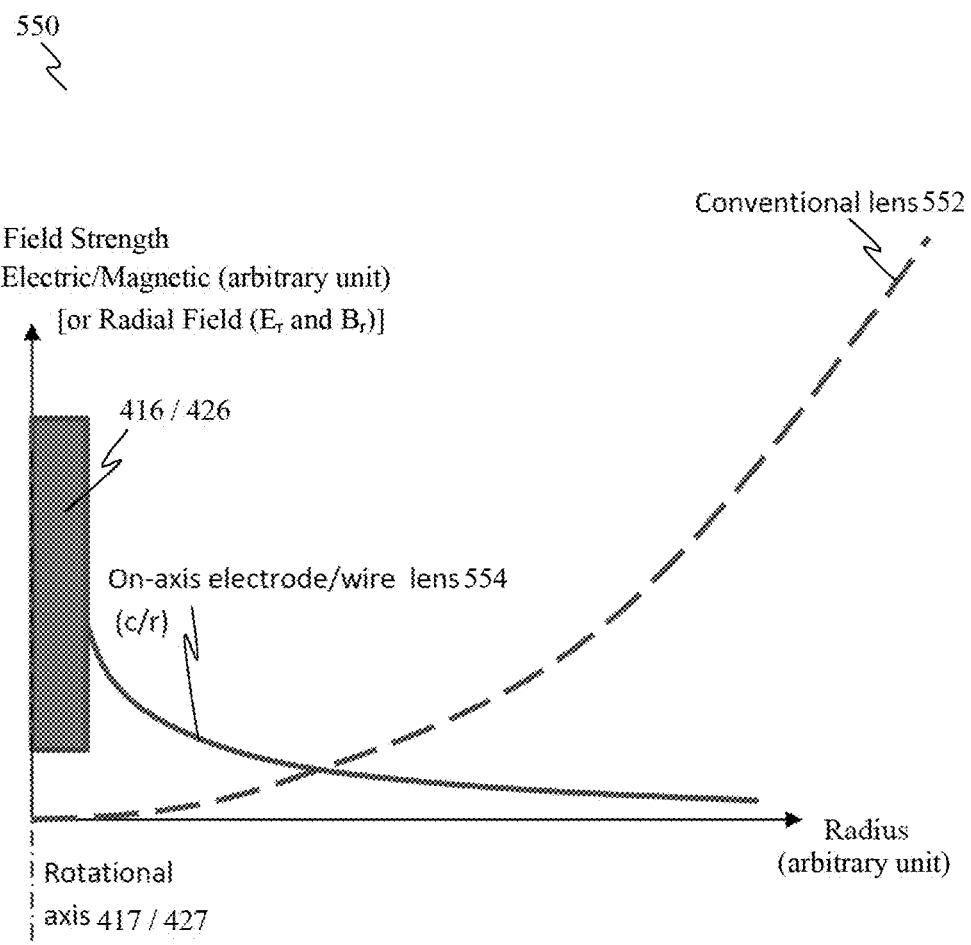
FIG. 5 shows a plot illustrating a comparison of field strength dependence as a function of radius using a conventional lens and using an on-axis electrode/wire lens of various embodiments.

FIG. 5 shows a plot 550 illustrating how the field strength in either corrector unit 400, 420 (either, $E_r$ or $B_\theta$) depends on radius, in comparison to the way the field strength varies inside electric/magnetic objective lenses. In FIG. 5, result 552 shows the radial field versus radius relationship for a conventional lens, while result 554 shows the radial field versus radius relationship for an on-axis electrode/wire lens of various embodiments. The structure represented as 416 or 426 refers to the on-axis electrode 416 (FIG. 4A) or the conductor 426 (FIG. 4B).

Both the well-known coaxial electric field solution, $E_r$, or the tangential magnetic field generated around a current carrying wire (Ampere Circuital Law), $B_\theta$, may be inversely proportional to the radius r, and may take the form c/r, where c is a constant, while the field strength (e.g., the radial component of the field) inside the electric or magnetic objective lenses increases with radius. Spherical aberration in the objective lens may come from the different focusing action experienced by electrons travelling at different radii. For example, wider angle electrons may travel along a larger radius path, and therefore may travel through stronger fields than the narrower angle ones. As a result of the stronger focusing action on the wider angle electrons, the point of focus for the wider angle electrons on the axis may occur before the point of focus for the narrower angle electrons, and this gives rise to the radius of spherical aberration. Unlike the situation for an objective lens (see, e.g., result 552), where the field strength drops in its central region (because the electrodes are located off-axis), the field strength in the corrector units 400, 420 may vary in the opposite way. For example, the field strength may increase as the radius becomes smaller (see, e.g., result 554). This may be made possible, for example, by the presence of its on-axis electrode/wire 416, 426. Therefore, unlike the situation in the objective lens, where the wider angle electrons (traveling at a larger radius) may experience a greater radial force than the narrower angle electrons, the wider angle electrons through the corrector unit 400, 420 may experience a smaller radial force than the narrower angle ones, and in this way, the spherical aberration effect of the objective lens may be reduced by the corrector unit 400, 420.

To what extent spherical aberration of an objective lens may be corrected by an on-axis electrode corrector unit (e.g., 400, 420) acting together with an annular aperture (e.g., 302) may be illustrated by carrying out direct ray tracing on a simple test example. An electrostatic Einzel objective lens 606 (e.g., a simple electrostatic Einzel objective lens column or an electric accelerating Einzel objective lens), as shown in a schematic view 600 of FIG. 6 may be considered for direct ray tracing.

Six electrons may pass through a 50 to 60 μm (inner radius=50 μm, outer radius=60 μm) annular aperture 604 in at least substantially uniform intervals and may leave the cathode-tip of a field emitter. The cathode-tip radius may be set at 50 nm.

The annular aperture (about 50 to 60 μm) 604 and the electrostatic corrector unit (or electrostatic corrector) 612 may be located about 5 cm from a 10 kV field emission source (e.g., a point-cathode gun 609), and are a distance of about 20 mm from a first electrode of the objective lens 606.

The middle electrode of the objective lens 606 may be set to 20 kV ($V_F$), which may form a focal point 6.53 mm beyond the last objective lens electrode (the working distance). The point-cathode gun 609, the annular aperture 604, the electrostatic corrector unit 612, the objective lens 606 and a specimen (0V) 603 may be aligned relative to one another along a rotational axis 607. In this case, a field emission gun or more specifically, the field emission gun tip may be modelled to be about 5 μm high and has a tip-radius of about 50 nm. However, similar spherical aberration results may be obtained by assuming the electrons leave a 10 kV point source. Inclusion of a field emission gun into the simulation model may allow for more realistic predictions of how the spherical aberration corrector 612 may affect other aberration, e.g., the chromatic on-axis aberration.

Simulations (direct ray tracing simulations) may be carried out by a commercial software program, Lorentz 2EM (Integrated Engineering Software, Canada). The program may calculate fields having rotational symmetry (two dimensions), and may neglect all three dimensional complications, such as end effects in a corrector unit. Any loss of beam current due to the radial supports at the corrector end plates may be assumed to be small and neglected.

Six rays at a single energy of about 0.2 eV for uniformly distributed emission angles from the cathode-tip may be plotted to go through the annular aperture 604, and the value of $V_C$ in the corrector unit 612 may be adjusted so that the root-mean-square (RMS) value of the final spot size may be minimized. The spherical aberration radius dependence on the final semi-angle may be investigated for four different sizes of annular aperture: 10-20, 30-40, 50-60 and 70-80 μm, and the results are compared to the aberration characteristics of corresponding hole apertures (about 17.32 μm, about 26.45 μm, about 33.1 μm and about 38.72 μm, respectively) that give the same transmission current.

Figure 7:
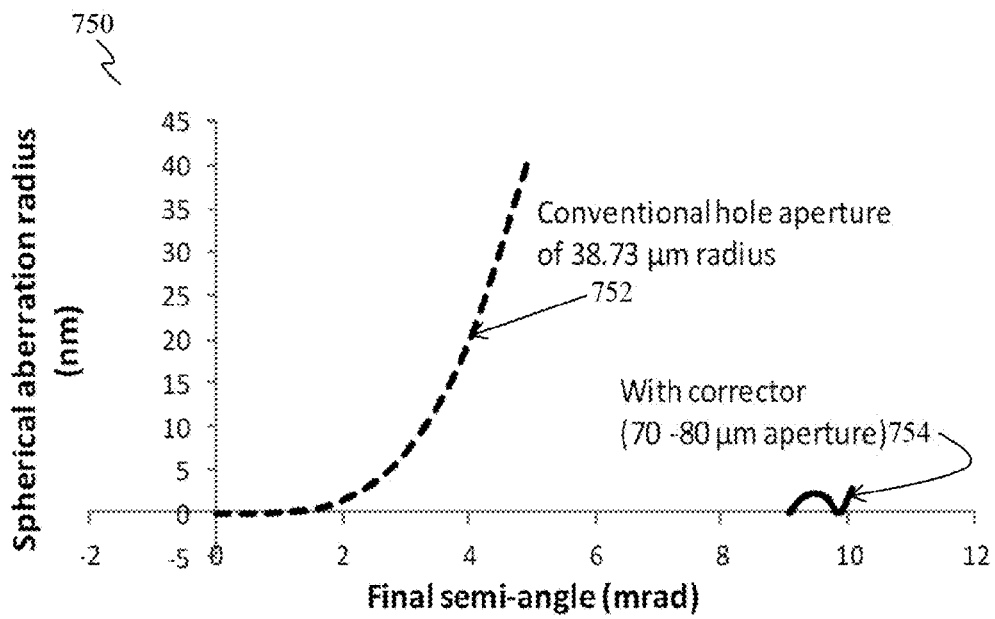
FIG. 7 shows a plot illustrating simulated spherical aberration radius for a 70-80 μm aperture as a function of the final semi-angle in comparison to a conventional hole aperture for transmission of the same beam current.

FIG. 7 shows a plot 750 illustrating simulated optimised corrected spherical aberration radius as a function of final semi-angle θ for a 70-80 μm annular aperture (see result 754), together with the results for an uncorrected (conventional) spherical aberration for a hole aperture that gives the same current or the same beam current (0 to about 38.72 μm) (see result 752). The RMS value of the corrected spherical aberration radius (1.75 nm) may typically be around one order of magnitude lower than its conventional counterpart (18.5 nm) and may be centred around a semi-angle of about 9 mrad.

The corrector voltage may be adjusted to minimize the RMS radius and may be found to be $V_C=-14.3$ volts.

Figure 8A:
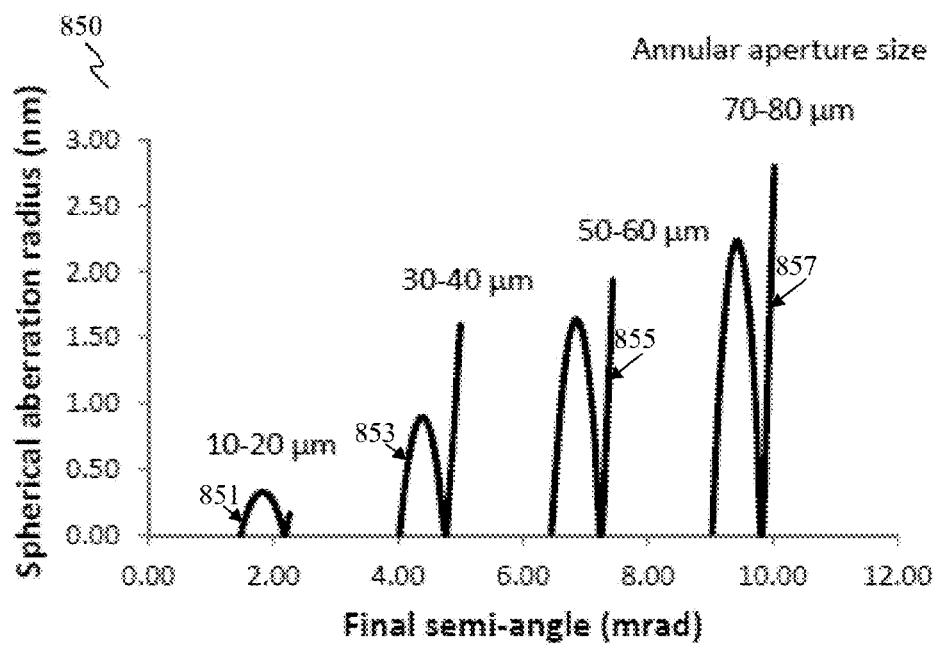
FIG. 8A shows a plot illustrating simulation results of spherical aberration radius as a function of final semi-angle for different annular aperture sizes each with a 10 μm width, according to various embodiments.
Figure 8B:
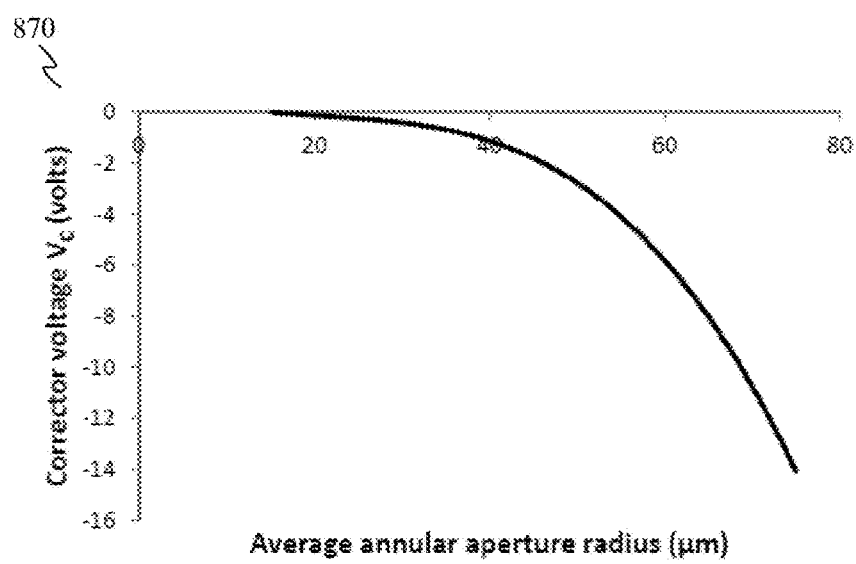
FIG. 8B shows a plot illustrating simulation results of corrector voltage values required to minimize the root-mean-square (RMS) radius for different annular aperture sizes each with a 10 μm width, according to various embodiments.

FIG. 8A shows a plot 850 illustrating how the optimised corrected spherical aberration radius goes down with decreasing annular aperture size, while FIG. 8B shows a plot 870 illustrating the corresponding corrector voltage ($V_c$) as a function of average annular aperture radius. In FIG. 8A, result 851 is for an annular aperture size of 10-20 µm, result 853 is for an annular aperture size of 30-40 µm, result 855 is for an annular aperture size of 50-60 µm, and result 857 is for an annular aperture size of 70-80 µm. In FIG. 8B, the magnitude (negative polarity) of the corrector voltage may increase exponentially as the average annular aperture radius increases.

Figure 9A:
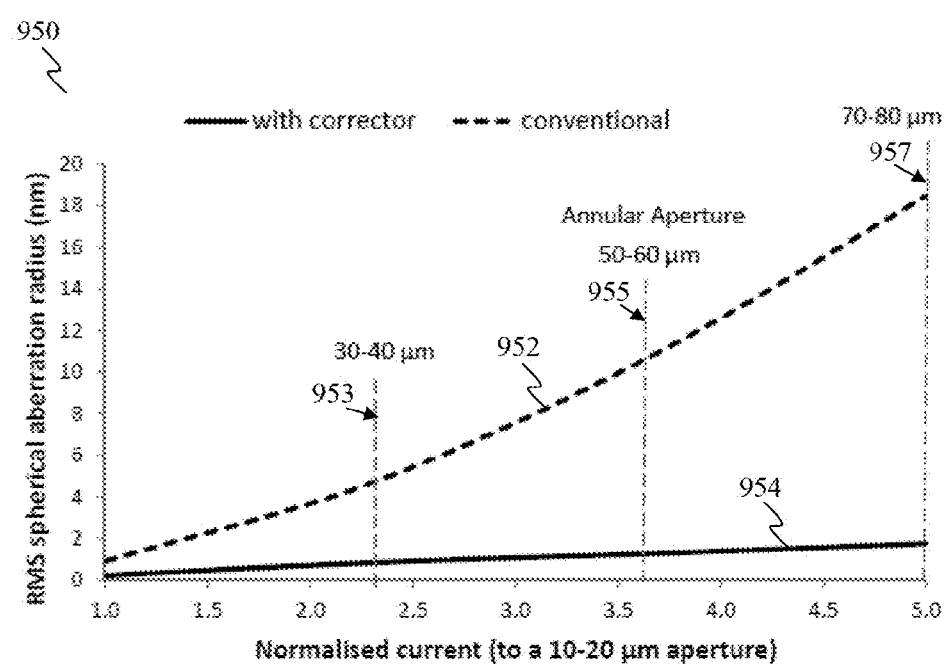
FIG. 9A shows a plot illustrating simulated root-mean-square (RMS) spherical aberration radius in comparison to a conventional aperture, as a function of normalized beam current (relative to the aperture size of 10-20 μm).

FIG. 9A shows a plot 950 illustrating the relationships between RMS spherical aberration radius and normalized current (to a 10-20 µm aperture). Variations of the beam may be caused by the use of different aperture sizes. Although the corrected spherical aberration radius goes down significantly (see result 954), the advantage over a conventional hole aperture (see result 952) may become less significant for small aperture sizes, as shown by the RMS spherical aberration radius as a function of relative transmitted beam current (normalised to the 10-20 µm aperture), compared for example along an indication 953 for an annular aperture of 30-40 µm) to an indication 955 for an annular aperture of 50-60 µm) and/or an indication 957 for an annular aperture of 70-80 µm) of FIG. 9A. This may be to be expected, since in the conventional case, the spherical aberration is proportional to $\theta^3$, which may fall rapidly with the semi-angle. The significance of the results shown in FIG. 9A is that the corrected spherical aberration may rise relatively slowly with increasing annular aperture size (probe current), much slower than for the conventional case. These results may predict that in situations where contributions from the other aberrations may be relatively low, the method of on-axis electrode correction with an annular aperture, in accordance with various embodiments, may be able to combine high spatial resolution with high transmitted current, something which is not possible to do in conventional scanning electron microscope systems.

Figure 9B:
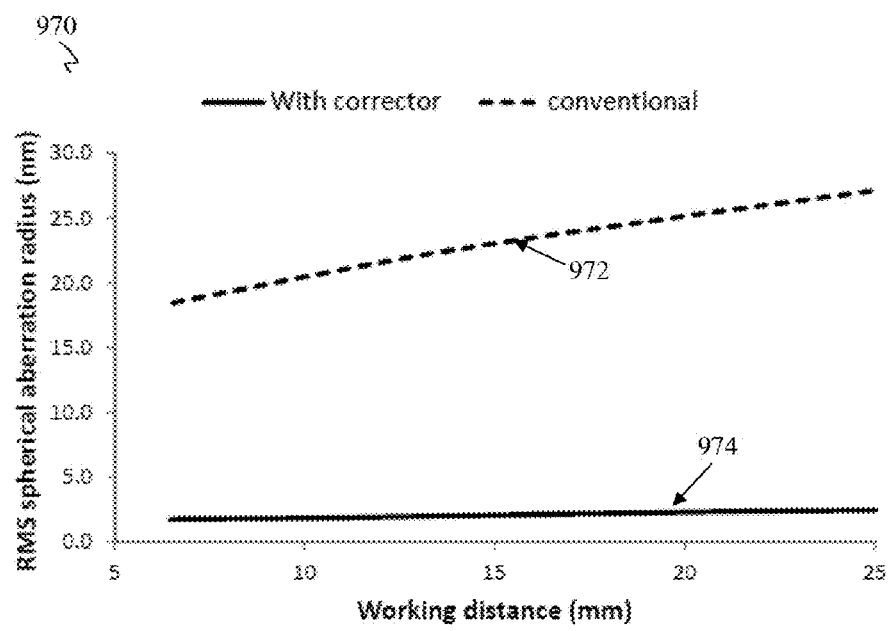
FIG. 9B shows a plot illustrating simulated root-mean-square (RMS) spherical aberration radius in comparison to a conventional aperture, as a function of working distance (distance from the last electrode of the objective lens to the point of focus) for the aperture size of 70-80 μm.

Another important advantage of the correction method in accordance with various embodiments over conventional scanning electron microscopes may be the dependence on working distance, as shown in plot 970 of FIG. 9B illustrating the relationships between the RMS spherical aberration radius and the working distance. Just as with increasing annular aperture size, the corrected spherical aberration radius may be observed to rise relatively slowly for increasing working distance (see result 974). For a four-fold increase in the working distance, the predicted corrected RMS spherical aberration radius may only go up by about 0.7 nm, while for the conventional case (see result 972), the RMS spherical aberration radius may go up by about 8.85 nm. These simulation results may predict that the aberration correction method may maintain its advantage over conventional systems for large working distances.

The question of how the on-axis electrode spherical aberration corrector may affect the other on-axis aberrations may need to be considered. Since the final semi-angular spread is decreased, about 1 mrad in this test example (see FIGS. 7 and 8A), one may expect the diffraction aberration to increase, since it is inversely proportional to the final semi-angular spread in conventional scanning electron microscopes. However, diffraction aberration in this case, may take a different form, since the central ray semi-angle at the focal point may not be zero. In the case of the 70-80 µm annular aperture, the central ray semi-angle may be about 9 mrad. Under such circumstances, so long as the electron source is coherent, which is the case for field emission guns, it may be the central ray semi-angle which determines diffraction aberration, and therefore, diffraction aberration may be expected to be relatively small, e.g., in the sub-nanometer range. However, for tungsten gun scanning electron microscopes, which are incoherent, the diffraction aberration in such example (10 kV, 1 mrad semi-angular spread) may be about 3.67 nm.

Figure 10:
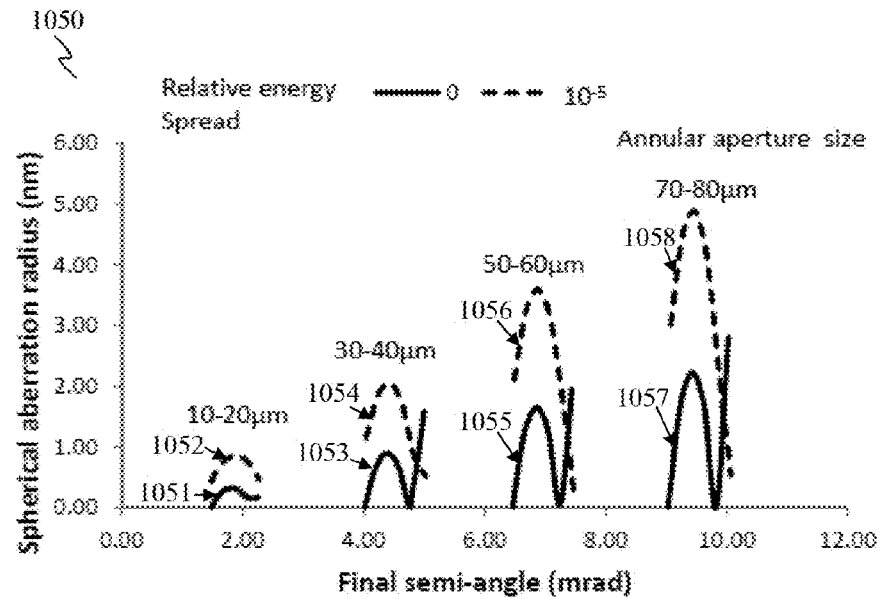
FIG. 10 shows a plot illustrating simulated spherical aberration radius for a relative energy spread of $10^{-5}$, according to various embodiments.

The on-axis electrode spherical aberration corrector may have the effect of increasing chromatic aberration since the correction procedure may involve enlarging the final semi-angle θ at the final point of focus. This may be indicated by plot 1050 of FIG. 10 illustrating the relationships between the spherical aberration radius and the final semi-angle, where a relative energy spread of $10^{-5}$ may be specified. In FIG. 10, result 1051 and result 1052 are for a relative energy spread of zero (0) and $10^{-5}$, respectively, for an annular aperture size of 10-20 µm, while result 1053 and result 1054 are for a relative energy spread of zero (0) and $10^{-5}$, respectively, for an annular aperture size of 30-40 µm, result 1055 and result 1056 are for a relative energy spread of zero (0) and $10^{-5}$, respectively, for an annular aperture size of 50-60 µm, and result 1057 and result 1058 are for a relative energy spread of zero (0) and $10^{-5}$, respectively, for an annular aperture size of 70-80 µm. As may be observed from FIG. 10, the RMS aberration radius may be simulated to be about 3.55 nm, compared to about 1.75 nm without chromatic aberration. This chromatic effect may be further reduced by operating at a higher primary beam voltage or using an energy monochromator. Scanning electron microscopes that have relatively small on-axis chromatic aberrations may be the 100 to 300 kV columns used for E-Beam Lithography and Scanning Transmission Electron Microscopy (STEM). The on-axis electrode/annular aperture method for correcting spherical aberration may be applied to these columns in order to acquire both high probe current and high spatial resolution.

Annular column designs may exist in the context of beta-ray spectrometers and correcting for the spherical aberration of electron microscopes. In the context of electron microscopy (or ion microscopy), a limitation of the annular spherical aberration correction method may be that for the same final probe current, the chromatic aberration may be increased. This may be because, annular systems may necessitate the use of larger semi-angles at the specimen compared to on-axis conventional systems, and chromatic aberration may directly scale with the magnitude of the final semi-angle. Although it may be in principle possible to correct for spherical aberration in the annular systems, such annular systems may naturally have higher levels of chromatic aberration compared to on-axis conventional systems for the same final probe current, and therefore, the correction of spherical aberration in the annular systems may not necessarily have smaller probe sizes than that of comparable conventional on-axis electron microscope systems. A much more effective method of aberration correction for annular electron microscopes may require the simultaneous correction of both spherical and chromatic aberration.

The on-axis electrode concept of various embodiments may provide a possibility of correcting for the chromatic aberration of an objective lens. In other words, various embodiments may provide a method that corrects for chromatic aberration (e.g., see FIG. 11A and/or FIG. 11B). This may be done by superimposing electric and magnetic corrector fields, integrating them into one unit. In this case, as illustratively shown in FIGS. 11A and 11B for (chromatic) aberration correction units 1100, 1120, the sign of the electric corrective force, $F_e$, may point radially outwards from a first conductive element 1112 towards a second conductive element 1114 that may be arranged rotationally symmetrical about the first conductive element 1112, while the direction of the magnetic corrective force, $F_m$, may point radially inwards from the second conductive element 1114 to the first conductive element 1112. The forces, $F_e$ and $F_m$, may be adjusted so that the net force on the electrons or ions at a particular angle (such as those that pass through the minimum radius of the annular aperture (not shown)) may be zero, as indicated in the chromatic aberration correction units 1100, 1120 with illustrated superimposed magnetic and electric fields. It should be appreciated that an annular aperture may be provided, for example, in a similar arrangement as shown in FIG. 3.

Figure 11A:
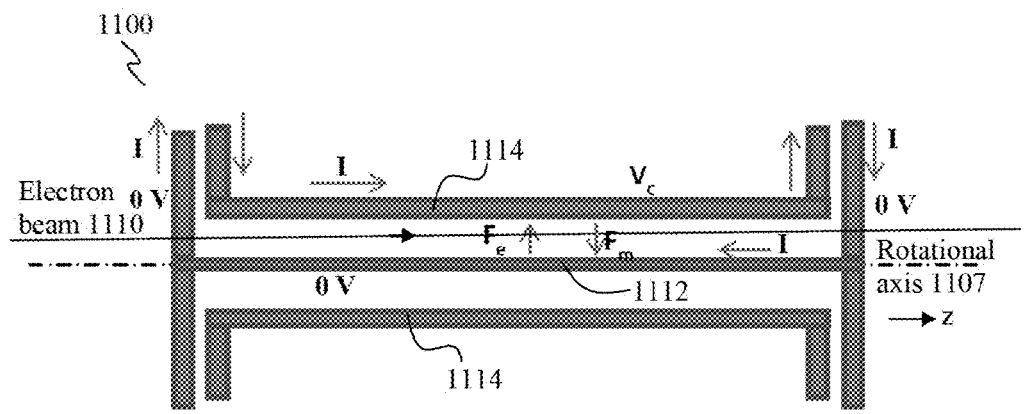

In FIG. 11A, an electron beam 1110 may travel through the chromatic aberration unit 1100 relative to a rotational axis 1107 in a z direction, in between the first and second conductive elements 1112, 1114. Current I may be provided to flow through the first conductive element (e.g., an on-axis electrode) 1112 and the second conductive element (e.g., an off-axis electrode) 1114 of the chromatic aberration corrector unit 1100 so as to generate $F_m$. A corrector voltage ($V_c$) may be applied to the second conductive element 1114 to generate a potential different between the first and second conductive elements 1112, 1114 so as to generate $F_e$. While one electron path (represented by beam 1110) is shown in FIG. 11A through the upper half of the corrector unit 1100, it should be appreciated that the beam 1110 also propagates through the lower half of the corrector unit 1100. For example, the beam 1110 may be rotationally symmetrical about the first conductive element 1112.

Figure 11B:
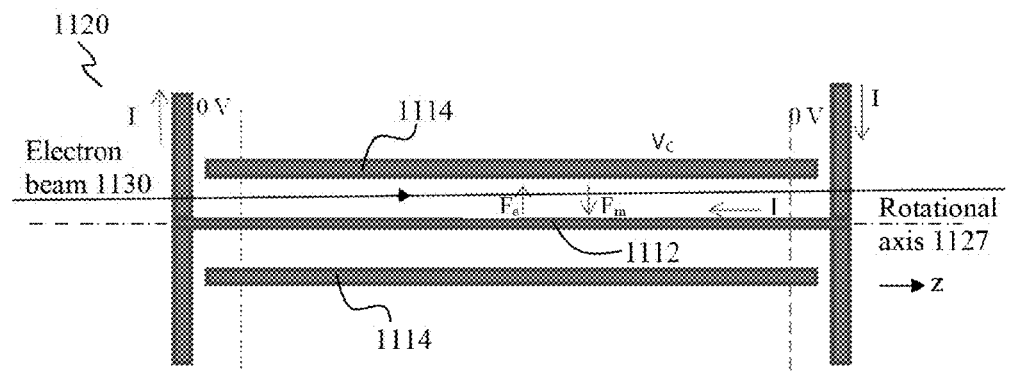

In FIG. 11B, an electron beam 1130 may travel through the chromatic aberration unit 1120 relative to a rotational axis 1127 in a z direction, in between the first and second conductive elements 1112, 1114. Current I may be provided to flow through the first conductive element (e.g., an on-axis electrode) 1112 of the chromatic aberration corrector unit 1120 so as to generate $F_m$. A corrector voltage ($V_c$) may be applied to the second conductive element 1114 to generate a potential different between the first and second conductive elements 1112, 1114 so as to generate $F_e$. While one electron path (represented by beam 1130) is shown in FIG. 11B through the upper half of the corrector unit 1120, it should be appreciated that the beam 1130 also propagates through the lower half of the corrector unit 1120. For example, the beam 1130 may be rotationally symmetrical about the first conductive element 1112.

Figure 11C:
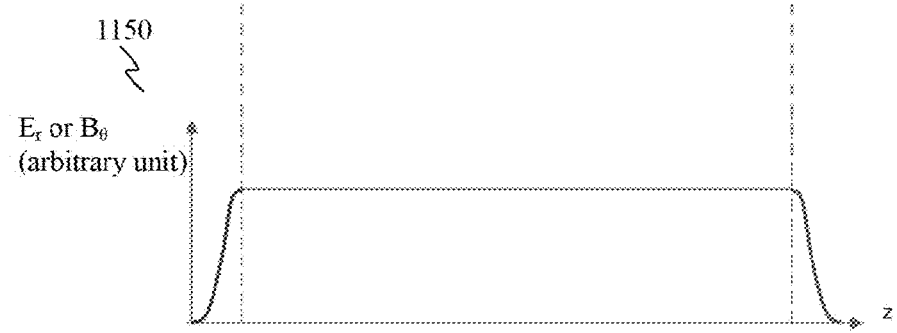
FIG. 11C shows a plot illustrating the behaviour of an electric field ($E_r$) or magnetic field ($B_\theta$) along an axis (z), according to various embodiments.

The strength of the magnetic field, $B_\theta$, along any point along the electron trajectory in the unit 1100, 1120 may be derived simply from the equations of motion in terms of the radial electric field, $E_r$, and the z-component of the minimum angle electron velocity, $v_{z0}$, at the entrance of the corrector unit 1100, 1120 so that, $B_\theta = E_r / v_{z0}$. The way both the electric field ($E_r$) and magnetic field $B_\theta$ vary at the ends of the unit, as a function of distance along the axis (z), may be matched. It may be assumed here that the effect of mismatch in fringe fields may be kept small. As long as the angular spread of electrons that pass through the corrector 1100, 1120 is relatively small, there may be no net radial force acting upon them, however, since the electrons may have an energy spread, there may be a radial force arising from variations in the z-component of their velocities. If an electron moves at a speed $v_z$ in the z-direction, then the radial force that it experiences, $\Delta F$, may be given by $-e(v_z - v_{z0})B_\theta$, where e is the charge of the electron. FIG. 11C shows a plot 1150 illustrating the behaviour of $E_r$ or $B_\theta$ along z for an on-axis electrode chromatic correction unit (e.g., as in FIG. 11B).

Faster electrons may experience a greater inward force (since $F_m$ points towards the axis), while slower electrons will may experience a radial force outwards. This may be opposite to the focusing action of the objective lens, where the faster electrons may experience a weaker focusing action than the slower electrons. In the case of the chromatic aberration unit 1100, 1120 with superimposed magnetic and electric fields, the mixed field on-axis electrode corrector 1100, 1120 may therefore be able to correct for the chromatic aberration of an objective lens. Electrons of higher energy may be focused further away (from the lens) than lower energy electrons. The corrector 1100, 1120 may provide a convergent action for higher energy electrons (faster than $v_{z0}$) and a divergent action for lower energy electrons (slower than $v_{z0}$), and in this way, by suitably scaling up both the electric field and magnetic field strengths inside the corrector 1100, 1120, the chromatic aberration of the objective lens may be compensated (e.g., compensated simultaneously).

Figure 6:
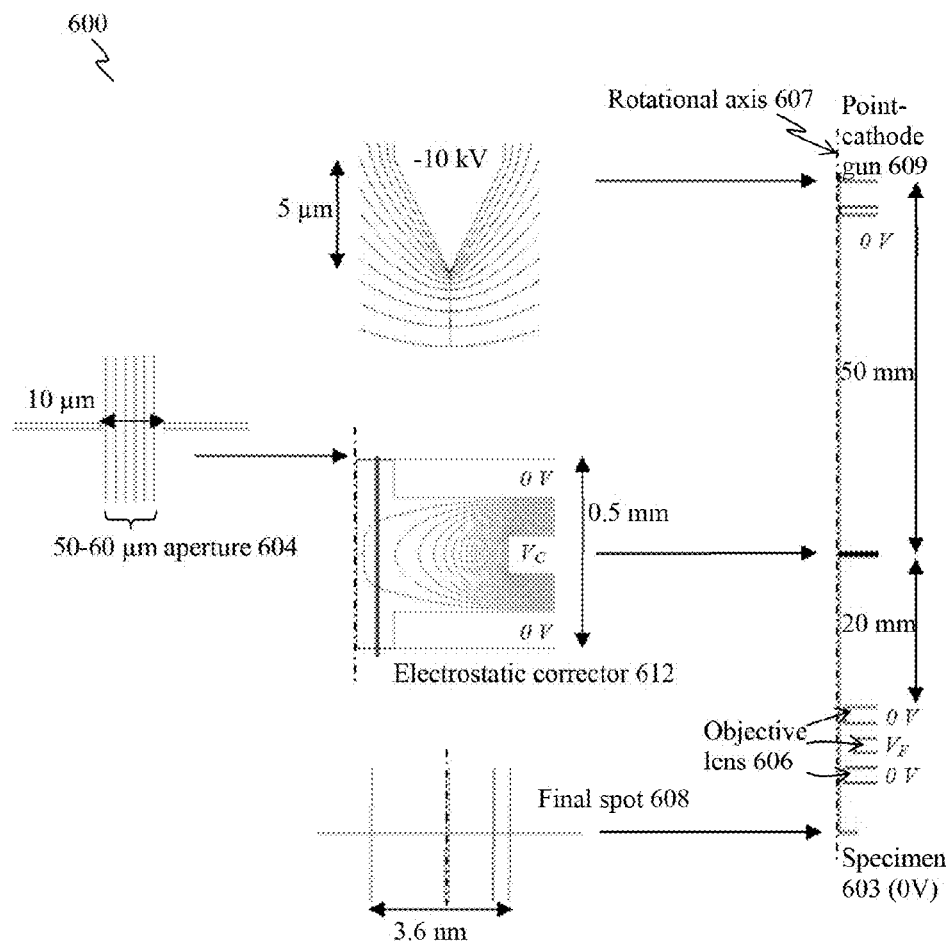
FIG. 6 shows a schematic view of direct ray tracing for an aberration correction apparatus with an electric accelerating Einzel objective lens, according to various embodiments.
Figure 12A:
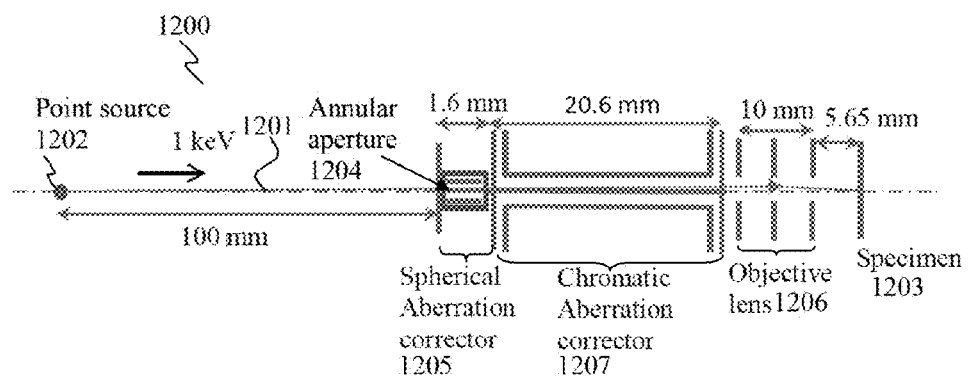
FIG. 12A shows a schematic cross-sectional view of a final stage for probe forming in a electron/ion microscope with an aberration corrector, according to various embodiments.
Figure 12B:
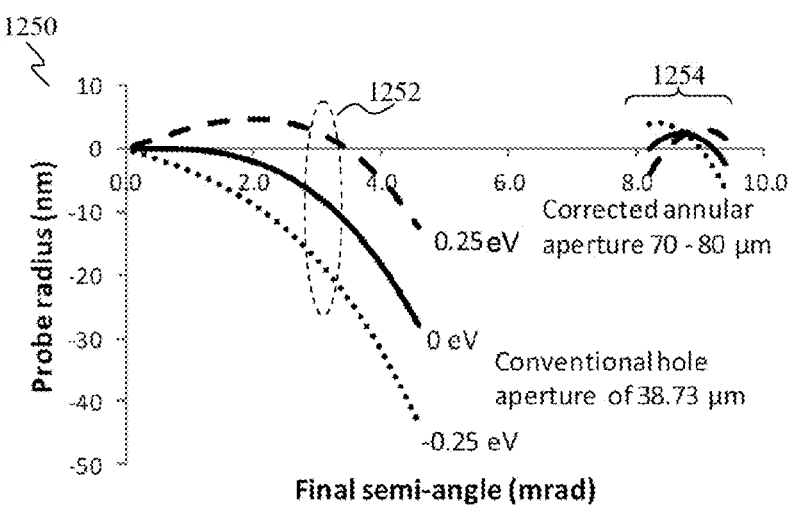
FIG. 12B shows simulation results for a combined chromatic and spherical aberration correctors for 1 keV column test example with a full width at half maximum (FWHM) energy spread of 0.5 eV.

The effectiveness of chromatic aberration together with spherical aberration may be illustrated for a simple accelerating Einzel objective lens simulation example (e.g., as described in FIG. 6). One example may be provided as shown in a schematic cross-sectional view of FIG. 12A, illustrating, e.g., a final stage 1200 for probe forming in an electron/ion microscope with aberration correction units 1205, 1207. In this example, a 1 keV electron beam 1201 may be produced by a simple point source 1202 located about 100 mm from the spherical aberration correction unit 1205, and the voltage in the Einzel lens 1206 may be set to 2 kV, producing a final point of focus of about 5.65 mm from the last lens electrode onto a specimen 1203. The first lens electrode of the objective lens 1206 may be about 10 mm apart from the last lens electrode. A chromatic aberration corrector 1207 (of a length about 20.6 mm) may be placed directly after the spherical aberration corrector unit 1205 (of a length of about 1.6 mm), with an annular aperture 1204 provided before the spherical aberration corrector unit 1205. The fields in both correctors 1205, 1207 may be generated by simple analytical expressions. In the main body of each corrector 1205, 1207, an infinitely long coaxial solution may be used for the electric case, and Ampere's Circuital Law around an infinitely long current carrying wire may be used for the magnetic case. At the ends of each unit 1205, 1207, a $[1+(dz/a)^2]^{-2}$ function fall-off may be used, where dz is the distance from the end, and "a" is a constant specifying how rapidly the functions falls. In this simple example, the diameters of the central wire (e.g., first conductive element) and the outer tube (e.g., second conductive element) may be about 100 μm and about 200 μm respectively, a=50 μm and an annular aperture whose pass radius may vary from 70 to 80 μm may be specified. Simulation of this test example may be carried out by finite-element field solving programs and direct ray tracing software. The simulation results of the probe size (e.g., probe radius) as a function of the final semi-angle are shown in plot 1250 of FIG. 12B for the optimised potentials of $V_{C1}$ (corrector voltage)=−0.00217 V (in the spherical corrector 1205), and $V_2$ (corrector voltage) =0.144 V (in the chromatic corrector 1207). More specifically, FIG. 12B shows a simulation example of a combined chromatic and spherical aberration corrector for a 1 keV column test example with a full width at half maximum (FWHM) energy spread of 0.5 eV. FIG. 12B shows result 1252 for a conventional hole aperture of about 38.73 μm and result 1254 for a corrected annular aperture of 70-80 μm of various embodiments. It may be predicted that for a FWHM energy spread of 0.5 eV (±0.25 eV), the average root-mean-square (RMS) radius of the combined spherical and chromatic aberration correction may be over a factor of 5 times smaller than for the uncorrected case (hole aperture giving the same probe current).

The excitation strength required in the chromatic aberration corrector 1207 may be orders of magnitude higher than that for the spherical aberration corrector 1205. In practice, the length of the chromatic corrector 1207 may need to be made large enough in order to avoid heat density limits in the central current carrying wire (e.g., 1112, FIGS. 11A, 11B). In this example, the 100 μm diameter current carrying wire may need to conduct about 55.4 mA, which may produce a current density of about 7.07 Amm$^{-2}$, exceeding the 4 Amm$^{-2}$ limit usually given for copper. However, the radial dimensions of the corrector 1207 may be scaled up. For a 140 μm diameter central wire (e.g., 1112, FIGS. 11A, 11B) (and 280 μm tube diameter, e.g., 1114, FIGS. 11A, 11B), the current density may fall to about 3.59 Amm$^{-2}$. The maximum diameter of the central wire may be determined by the annular aperture inner diameter. For the chromatic aberration correction of ion beams, depending on the optics of the column, simply increasing the length of the chromatic corrector may not be possible, in which case, other means of obtaining the required current density may be needed, such as the use of superconducting central wire electrodes. By having both spherical aberration corrector and chromatic aberration corrector, it may be possible to have high spatial resolution and high probe current, for example, in scanning electron microscopes (SEMs).

As described, various embodiments may provide a method for using on-axis electrode lenses to correct for both spherical and chromatic aberrations of electron or ion probe forming microscopes. By correcting for both chromatic and spherical aberrations, this design may be predicted to have significantly smaller final probe sizes than achievable with conventional electron/ionprobe forming microscopes for the same probe current, or conversely, it may be predicted to have larger final probe currents for the same final probe size. The method may be based upon using a chromatic aberration corrector unit together with a spherical aberration unit.

Figure 13A:
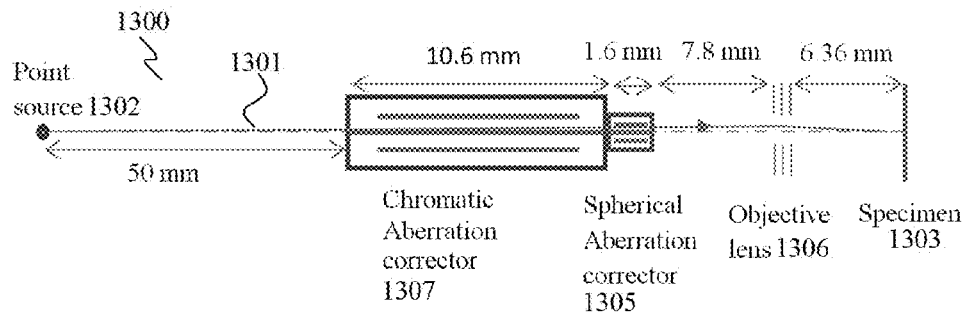
FIG. 13A shows a schematic cross-sectional view of one example illustrating chromatic and spherical aberration correction for an electric accelerating Einzel objective lens, according to various embodiments.

FIG. 13A shows a schematic cross-sectional view of another example of an apparatus 1300 with chromatic and spherical aberration correction for an electric accelerating Einzel objective lens, for illustrating the effectiveness of chromatic aberration together with spherical aberration for a simple accelerating Einzel objective lens simulation. In this example of FIG. 13A, a 1 kV electron beam 1301 may be produced by a simple point source 1302 located about 50 mm from a chromatic aberration correction unit 1307, and the voltage in the Einzel lens 1306 may be set to 2 kV, producing a final point of focus of about 6.36 mm from the last lens electrode of the objective lens 1306, at a specimen 1303. An electric spherical aberration corrector 1305 (having a length of about 1.6 mm long) may be placed directly after the chromatic aberration corrector unit 1307 (having a length of about 10.6 mm long). The procedure for correcting both chromatic and spherical aberrations may be to first apply voltage/current excitation to the chromatic corrector 1307, and then apply excitation to the spherical corrector 1305 to obtain a minimum spot size, and then repeat this cycle, at each stage monitoring the overall probe size and arriving at the conditions for which it is minimized.

The fields in both correctors 1305, 1307 may be generated by the same simple analytical expressions as described above for FIG. 12A for an infinitely long coaxial solution and Ampere's Circuital Law. In this example (FIG. 13A), the diameters of the central wire (e.g., 1112, FIGS. 11A, 11B) and the electric deflector (e.g., 1114, FIGS. 11A, 11B) may be about 100 μm and about 200 μm, respectively, a=50 μm and an annular aperture whose pass radius varies from 70 to 80 μm may be specified, similar to those of FIG. 12A. At first, the voltage on the electric spherical corrector 1305 may be adjusted to minimise the output spot size with no chromatic correction.

Figure 13B:
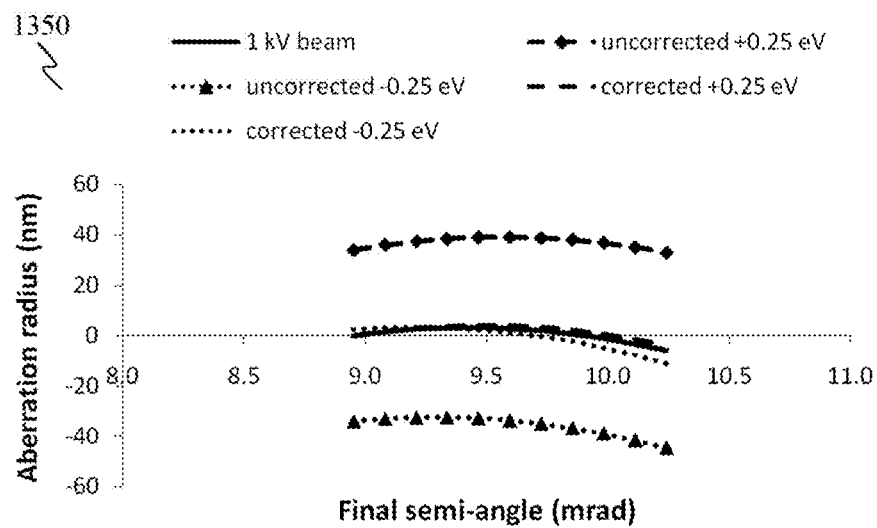
FIG. 13B shows a plot illustrating simulated aberration radius dependence of the final semi-angle for chromatic and spherical aberration correction for an accelerating Einzel objective lens, according to various embodiments.

FIG. 13B shows a plot 1350 illustrating simulated aberration radius dependence of the final semi-angle for chromatic and spherical aberration correction for an accelerating Einzel objective lens test example, (e.g., FIG. 13A), with (corrected) and without (uncorrected) chromatic aberration correction. Only about −0.00379 V may be required to reduce the root-mean-square (RMS) radius of about 2.745 nm (falling from of about 53.3 nm with no spherical aberration correction). Under these conditions, for an energy spread of 0.25 eV (with respect to 1 keV) in the electron beam, the final spot RMS radius may be found to be about 37.36 nm, while for −0.25 eV, the final spot RMS radius may be about 35.6 nm. Then the strengths of the fields in the chromatic aberration unit (e.g., 1307) may be gradually increased, carefully monitoring the effect on the final spot size. The chromatic aberration part of the final spot may decrease. Conditions for a minimum final spot size may be found for an electric deflector voltage, $V_C$, of about 0.36 V (about 138 mA current in the on-axis wire), where the RMS radius of the final spot may be found to be about 3 nm for no energy spread, about 5.31 nm for an energy spread of 0.25 eV, and about 4.47 nm for an energy spread of −0.25 eV. The effect of chromatic aberration not only enlarged the spot size for no energy spread, but may have made it unsymmetric with respect to energy spread. However, by a small adjustment in the voltage of the electric deflector in the spherical aberration corrector (e.g., 1305), to about −0.00375 V, the final RMS spot radius may be reduced to about 2.8 nm for no energy spread, and about 4.81 nm for both 0.25 and −0.25 eV energy spreads. It may be demonstrated that although the chromatic aberration corrector (e.g., 1307) adds a small amount of spherical aberration, it may be compensated by fine tuning the spherical aberration corrector deflector voltage. The simulation results of FIG. 13B demonstrate that the chromatic aberration correction may be expected to reduce the final spot size by about an order of magnitude for this simple example, where the total energy spread may be 0.5 eV in a 1 kV beam focusing at a working distance of about 6.36 mm.

It may be important to recognise that the chromatic aberration correction may require much higher field strengths than the spherical aberration correction. If the length of both correctors are kept the same, the deflector voltage, $V_C$, in the chromatic aberration corrector unit (e.g., 1307) may typically be two to three orders of magnitude higher than for the electric spherical aberration corrector (e.g., 1305). This, depending on the beam voltage, the chromatic aberration corrector length, and the diameter of the central current carrying wire, may lead to impractical current densities in the wire. On the other hand, the length of the chromatic aberration corrector may be increased to compensate for this. In the present example for instance, a 140 µm on-axis diameter wire (e.g., 1112, FIGS. 11A, 11B) with a length of 22.32 mm may give a current density of 4 A/mm².

The chromatic aberration correction results shown in FIG. 13B may be compared to the chromatic aberration of its conventional counterpart. In the conventional case, 1 kV beam may travel through a hole aperture of radius of about 38.72 µm (giving the same beam current as the 70 to 80 µm annular aperture) without the presence of corrector units. A maximum semi-angle of about 5 mrad may be produced at the specimen, where the radius changes by about 38 nm for a 0.5 eV energy spread (−0.25 to 0.25 eV). Compare this with a corresponding 7.3 nm change of radius for the on-axis electrode aberration corrected column at its maximum semi-angular spread (about 1.3 mrad), an improvement of better than (or more than) a factor of five for the final spot radius may be achieved. These simulation results may predict that the on-axis electrode aberration correction method, in accordance with various embodiments, may provide a better combination of spatial resolution and probe current than existing conventional scanning electron microscopes.

An approximate estimate of the diffraction aberration at radius r at the focal plane, M(r), with wavenumber k for a ring aperture having radii $R_1$ and $R_2$ projecting semi-angles $\theta_1$ and $\theta_2$ may be estimated by using the well-known Fraunhofer formula (as shown in Equation (1)) for circular shaped apertures, $$M(r) = \frac{M(0)}{(1-\varepsilon^2)} \left[ \frac{2J_1(X_2)}{X_2} - \frac{2J_1(X_1)}{X_1}\varepsilon^2 \right] \qquad \text{Equation (1)}$$

where M(0) is the diffraction pattern value on the axis (r=0), $J_1$ is the Bessel function of the first kind, order 1, $\varepsilon=R_1/R_2$, $X_2 = k\, r \sin\theta_2$, and $X_1 = k\, r \sin\theta_1$.

The above function may be transformed into a normalised intensity pattern $[M(r)/M(0)]^2$ and may be integrated as a function of radius to estimate the diffraction radius which contains 50% of the total current.

Figure 14:
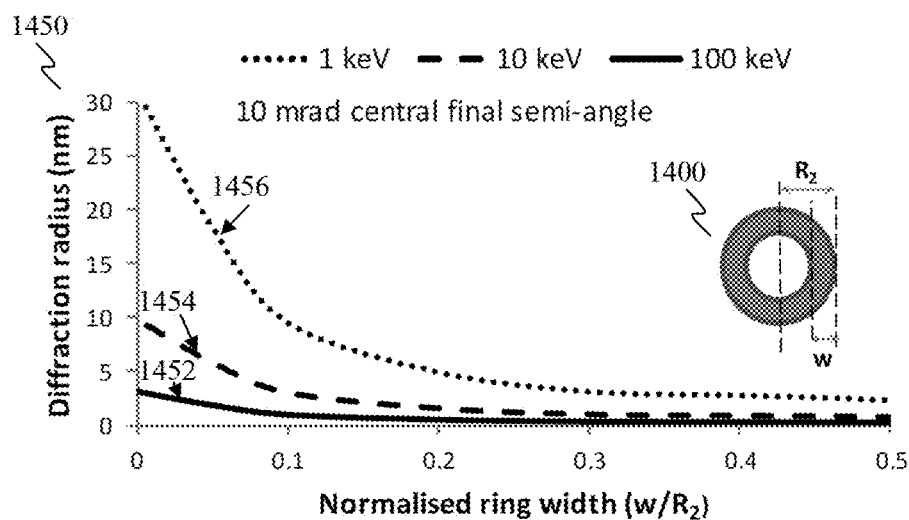
FIG. 14 shows a plot illustrating calculated diffraction limited radius containing 50% of probe current as a function of normalised ring width for different electron beam energies, according to various embodiments.

Plot 1450 of FIG. 14 shows calculated diffraction limited radius containing 50% of probe current as a function of normalised ring width for different electron beam energies. The inset shows a ring or annular aperture 1400 with an outer radius $R_2$ and a ring width w. In FIG. 14, result 1452 is for an energy level of 1 keV, while result 1454 is for an energy level of 10 keV and result 1456 is for an energy level of 100 keV. As the ring width decreases, more of the current may be transferred to the outer fringes, and the diffraction radius may rise particularly sharply for the normalised width range between 0 to 0.1. On the other hand, the diffraction radius may decrease with average semi-angle, and in practice, a compromise may be needed between decreasing the ring width to lower the chromatic and spherical aberrations, while at the same time enlarging it to prevent diffraction aberration from becoming too large. For the 10 keV example column probe characteristics shown in FIG. 7, (normalised ring width of 0.125), the 50% current diffraction aberration radius may be about 2.85 nm. For the 1 keV example shown in FIG. 12B, the diffraction radius may be about 9.25 nm (70 to 80 µm radius aperture), which may drop to 5.26 nm for a 60 to 80 µm radius annular aperture. Although the corrected RMS spherical aberration radius may go up to about 6.33 nm, it may still be about a factor of 4 to 5 better than (or more than) the probe radius predicted for the corresponding hole aperture at the same beam current.

Initial promising applications for the aberration correction method described herein may include aberration correction for the Helium Ion Microscope, Focused Ion Beam columns, High Voltage Electron Beam Lithography instruments and Scanning Transmission Electron Microscopes.

Various embodiments may increase the spatial resolution significantly without compromising on the SNR performance of the probe size. As described above, various embodiments may advantageously address two types of correction (chromatic and spherical) aberrations simultaneously in conjunction with an annular aperture. However, there may be challenges with a lower depth of focus, for example, due to a steeper angle incident on the specimen.

Although alternative (e.g., transmission electron microscopy (TEM)) may be available to address spatial resolution, there remains a potential industry interest for features (e.g., in accordance with various embodiments) to increase spatial resolution without compromising probe size (in turn the resolution).

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. An aberration correction apparatus comprising:
    an aberration correction unit comprising:
        a first conductive element; and
        a second conductive element arranged rotationally symmetrical about the first conductive element,
        wherein the aberration correction unit is arranged to propagate an annular beam comprising charged particles in between the first conductive element and the second conductive element such that propagation of the annular beam through the aberration correction unit is rotationally symmetrical about the first conductive element, and
        wherein the aberration correction unit is configured to generate, between the first conductive element and the second conductive element, a magnetic field force and an electric field force directed in opposite directions and superimposed on each other to act on the charged particles to change a trajectory of the charged particles; and
    an annular aperture optically coupled to the aberration correction unit.

2. The aberration correction apparatus as claimed in claim 1, wherein the aberration correction unit is configured to generate the magnetic field force in response to a current received by the first conductive element such that the magnetic field force is in a direction from the second conductive element to the first conductive element.

3. The aberration correction apparatus as claimed in claim 1, wherein the aberration correction unit is configured to generate the electric field force in response to a potential difference generated between the first conductive element and the second conductive element such that the electric field force is in a direction from the first conductive element to the second conductive element.

4. The aberration correction apparatus as claimed in claim 1,
    wherein, out of the charged particles comprised in the annular beam, for a first charged particle having a first velocity, the magnetic field force and the electric field force co-operate to generate a first resultant force acting on the first charged particle to change a trajectory of the first charged particle towards the first conductive element, and wherein, out of the charged particles comprised in the annular beam, for a second charged particle having a second velocity different from the first velocity, the magnetic field force and the electric field force co-operate to generate a second resultant force acting on the second charged particle to change a trajectory of the second charged particle away from the first conductive element.

5. The aberration correction apparatus as claimed in claim 4, wherein the first velocity of the first charged particle is higher than the second velocity of the second charged particle, wherein the first resultant force acting on the first charged particle comprises a net magnetic field force acting on the first charged particle, and wherein the second resultant force acting on the second charged particle comprises a net electric field force acting on the second charged particle.

6. The aberration correction apparatus as claimed in claim 1, wherein the first conductive element has a diameter of between about 50 μm and about 1 mm.

7. The aberration correction apparatus as claimed in claim 1, wherein the first conductive element has a length of between about 1 mm and about 50 mm.

8. The aberration correction apparatus as claimed in claim 1, wherein the first conductive element has a central longitudinal axis, and wherein the annular aperture is arranged rotationally symmetrical about the central longitudinal axis.

9. The aberration correction apparatus as claimed in claim 1, wherein the annular aperture is defined by an inner radius of between about 10 μm and about 70 μm and an outer radius of between about 20 μm and about 80 μm.

10. The aberration correction apparatus as claimed in claim 1, further comprising an additional aberration correction unit optically coupled to the aberration correction unit.

11. The aberration correction apparatus as claimed in claim 10, wherein a longitudinal dimension of the aberration correction unit is larger than a longitudinal dimension of the additional aberration correction unit.

12. The aberration correction apparatus as claimed in claim 10, wherein the additional aberration correction unit comprises:

a first conductive member; and a second conductive member arranged rotationally symmetrical about the first conductive member, wherein the additional aberration correction unit is arranged to propagate the annular beam between the first conductive member and the second conductive member such that propagation of the annular beam through the additional aberration correction unit is rotationally symmetrical about the first conductive member, and wherein the additional aberration correction unit is configured to generate an additional electric field force between the first conductive member and the second conductive member to act on the charged particles to change a trajectory of the charged particles.

13. The aberration correction apparatus as claimed in claim 10, wherein the additional aberration correction unit comprises a conductor, wherein the additional aberration correction unit is arranged to propagate the annular beam such that propagation of the annular beam through the additional aberration correction unit is rotationally symmetrical about the conductor, and wherein the additional aberration correction unit is configured to generate an additional magnetic field force to act on the charged particles to change a trajectory of the charged particles.

14. The aberration correction apparatus as claimed in claim 1, wherein the annular aperture is arranged to generate the annular beam for propagation through the aberration correction unit.

15. A method for correcting aberration of charged particles, the method comprising:

providing an annular beam comprising charged particles;

generating a magnetic field force and an electric field force directed in opposite directions and superimposed on each other to act on the charged particles to change a trajectory of the charged particles;

wherein the providing an annular beam comprises propagating the annular beam through an aberration correction unit in between a first conductive element of the aberration correction unit and a second conductive element of the aberration correction unit, wherein the second conductive element is arranged rotationally symmetrical about the first conductive element, and wherein propagation of the annular beam through the aberration correction unit is rotationally symmetrical about the first conductive element, and wherein the generating a magnetic field force and an electric field force comprises generating the magnetic field force and the electric field force between the first conductive element and the second conductive element.

16. The method as claimed in claim 15, wherein generating a magnetic field force between the first conductive element and the second conductive element comprises applying a current to the first conductive element such that the magnetic field force is in a direction from the second conductive element to the first conductive element.

17. The method as claimed in claim 15, wherein generating an electric field force between the first conductive element and the second conductive element comprises generating a potential difference between the first conductive element and the second conductive element such that the electric field force is in a direction from the first conductive element to the second conductive element.

18. The method as claimed in claim 15, wherein, out of the charged particles comprised in the annular beam, for a first charged particle having a first velocity, the magnetic field force and the electric field force co-operate to generate a first resultant force acting on the first charged particle to converge the first charged particle, and wherein, out of the charged particles comprised in the annular beam, for a second charged particle having a second velocity different from the first velocity, the magnetic field force and the electric field force co-operate to generate a second resultant force acting on the second charged particle to diverge the second charged p article.

19. The method as claimed in claim 18, wherein the first velocity of the first charged particle is higher than the second velocity of the second charged particle, wherein the first resultant force acting on the first charged particle comprises a net magnetic field force acting on the first charged particle, and wherein the second resultant force acting on the second charged particle comprises a net electric field force acting on the second charged particle.

20. The method as claimed in claim 15, further comprising correcting for a spherical aberration associated with the charged particles.

21. A device employing charged particles, the device comprising:
an aberration correction unit comprising:
a first conductive element; and
a second conductive element arranged rotationally symmetrical about the first conductive element,
wherein the aberration correction unit is arranged to propagate an annular beam comprising charged particles in between the first conductive element and the second conductive element such that propagation of the annular beam through the aberration correction unit is rotationally symmetrical about the first conductive element, and
wherein the aberration correction unit is configured to generate, between the first conductive element and the second conductive element, a magnetic field force and an electric field force directed in opposite directions and superimposed on each other to act on the charged particles to change a trajectory of the charged particles;
an annular aperture optically coupled to the aberration correction unit; and
a lens arrangement optically coupled to the aberration correction unit.

22. The device as claimed in claim 21,
wherein, out of the charged particles comprised in the annular beam, for a first charged particle having a first velocity, the magnetic field force and the electric field force co-operate to generate a first resultant force acting on the first charged particle to change a trajectory of the first charged particle towards the first conductive element, and
wherein, out of the charged particles comprised in the annular beam, for a second charged particle having a second velocity different from the first velocity, the magnetic field force and the electric field force co-operate to generate a second resultant force acting on the second charged particle to change a trajectory of the second charged particle away from the first conductive element.

23. The device as claimed in claim 21, further comprising a spherical aberration correction unit optically coupled to the aberration correction unit.

24. The device as claimed in claim 21, wherein the annular aperture is arranged to generate the annular beam for propagation through the aberration correction unit.

* * * * *